US012665021B2

(12) United States Patent　　　(10) Patent No.:　US 12,665,021 B2

Kim et al.　　　　　　　　　　　　(45) Date of Patent:　Jun. 23, 2026

(54) NEUROMORPHIC SYSTEM USING MEMORY ARRAY WITH CROSS-POINT STRUCTURE

(71) Applicant: IHW Inc., Yongin-si (KR)

(72) Inventors: Jun-sung Kim, Baltimore, MD (US);
Sang-hoon Yoon, Seongnam-si (KR)

(73) Assignee: IHW INC., Yongin-si (KR)

( * ) Notice: Subject to any disclaimer, the term of this patent is extended or adjusted under 35 U.S.C. 154(b) by 557 days.

(21) Appl. No.: 18/271,702

(22) PCT Filed: Jan. 29, 2021

(86) PCT No.: PCT/KR2021/001221
§ 371 (c)(1),
(2) Date: Jul. 11, 2023

(87) PCT Pub. No.: WO2022/163883

PCT Pub. Date: Aug. 4, 2022

(65) Prior Publication Data

US 2024/0312516 A1　　Sep. 19, 2024

(51) Int. Cl.
G11C 11/54　　　(2006.01)
G06N 3/063　　　(2023.01)
G11C 7/16　　　(2006.01)

(52) U.S. Cl.
CPC .............. G11C 11/54 (2013.01); G06N 3/063 (2013.01); G11C 7/16 (2013.01)

(58) Field of Classification Search
CPC ............ G11C 11/54; G11C 7/16; G06N 3/063
See application file for complete search history.

(56) References Cited

U.S. PATENT DOCUMENTS

| | | | | |
|---|---|---|---|---|
| 9,990,580 B2 * | 6/2018 | Eleftheriou | ............ | G06N 3/049 |
| 11,093,823 B2 * | 8/2021 | Lee | ......................... | G06N 3/063 |

(Continued)

FOREIGN PATENT DOCUMENTS

| | | |
|---|---|---|
| JP | 6818116 | 1/2021 |
| KR | 10-2018-0110080 | 10/2018 |

(Continued)

OTHER PUBLICATIONS

Garbin Daniele et al., "HfO2-Based OxRAM Devices as Synapses for Convolutional Neural Networks" IEEE Transactions on Electron Devices, IEEE, USA, vol. 62, No. 8, pp. 2494-2501, Aug. 2015.

(Continued)

*Primary Examiner* — David E Choi

(74) *Attorney, Agent, or Firm* — LEX IP MEISTER, PLLC

(57)　　　　　　ABSTRACT

An object of the present invention is to provide a neuromorphic system including a synaptic unit capable of causing a gradual change in resistance for analog information processing, and an operating method therefor. In order to achieve the above object, an aspect of the present invention may provide a neuromorphic system including an input signal unit for generating an input signal, a synapse unit including a plurality of synaptic units that receive a signal of the input signal unit and cause a current to flow according to a set weight, an output signal unit for generating an output signal by receiving a current generated from the synapse unit, and a controller unit for controlling the input signal unit, the synapse unit, and the output signal unit, in which the input signal unit includes a digital-to-analog converter (DAC), the synaptic units include a plurality of memory cells that are connected to each other and are each capable of selectively storing a logic state, the plurality of memory cells are arranged in a cross-point structure including an (Continued)

input electrode line and an output electrode line that cross each other to form one or more memory arrays, the output signal unit includes an analog-to-digital converter (ADC), and the controller unit generates an analog input signal through the DAC in the input signal unit, allows the generated analog input signal to be applied to each of the plurality of memory cells included in the synaptic unit so that a current flows, and generates a sum of currents flowing from the plurality of memory cells as the output signal through the ADC in the output signal unit.

21 Claims, 14 Drawing Sheets

(56) References Cited

U.S. PATENT DOCUMENTS

| | | | | |
|---|---|---|---|---|
| 11,989,646 | B2* | 5/2024 | Park | G06N 3/063 |
| 2017/0300806 | A1* | 10/2017 | Lee | G06N 3/08 |
| 2018/0225566 | A1* | 8/2018 | Lee | G06N 3/049 |
| 2018/0285721 | A1* | 10/2018 | Lee | G06N 3/065 |
| 2018/0300612 | A1* | 10/2018 | Lee | G06N 3/063 |
| 2019/0019081 | A1* | 1/2019 | Kim | G06N 3/063 |
| 2020/0050928 | A1* | 2/2020 | Narayanan | G06N 3/065 |
| 2020/0349421 | A1 | 11/2020 | Tran et al. | |
| 2020/0411066 | A1 | 12/2020 | Choi et al. | |
| 2022/0270675 | A1* | 8/2022 | Kim | G11C 11/54 |
| 2023/0162787 | A1* | 5/2023 | Kim | G11C 13/0002 |
| | | | | 365/151 |
| 2024/0312516 | A1* | 9/2024 | Kim | G11C 13/0028 |

FOREIGN PATENT DOCUMENTS

| | | |
|---|---|---|
| KR | 10-2019-0007642 | 1/2019 |
| KR | 10-1997868 | 7/2019 |
| KR | 10-2021-0000987 | 1/2021 |
| WO | 2021-011923 | 1/2021 |

OTHER PUBLICATIONS

EPO, Supplementary European Search Report of Application No. 21923317.8, dated Dec. 17, 2024, total 8 pages.

Danial, Loai, et al. "Two-terminal floating-gate transistors with a low-power memristive operation mode for analogue neuromorphic computing." Nature Electronics (Dec. 9, 2019): pp. 1-10.

Guo, Xinjie, et al. "Temperature-insensitive analog vector-by-matrix multiplier based on 55 nm NOR flash memory cells." 2017 IEEE Custom Integrated Circuits Conference (CICC). IEEE, 2017. (Jul. 27, 2017): pp. 1-4.

* cited by examiner

[Fig. 1]
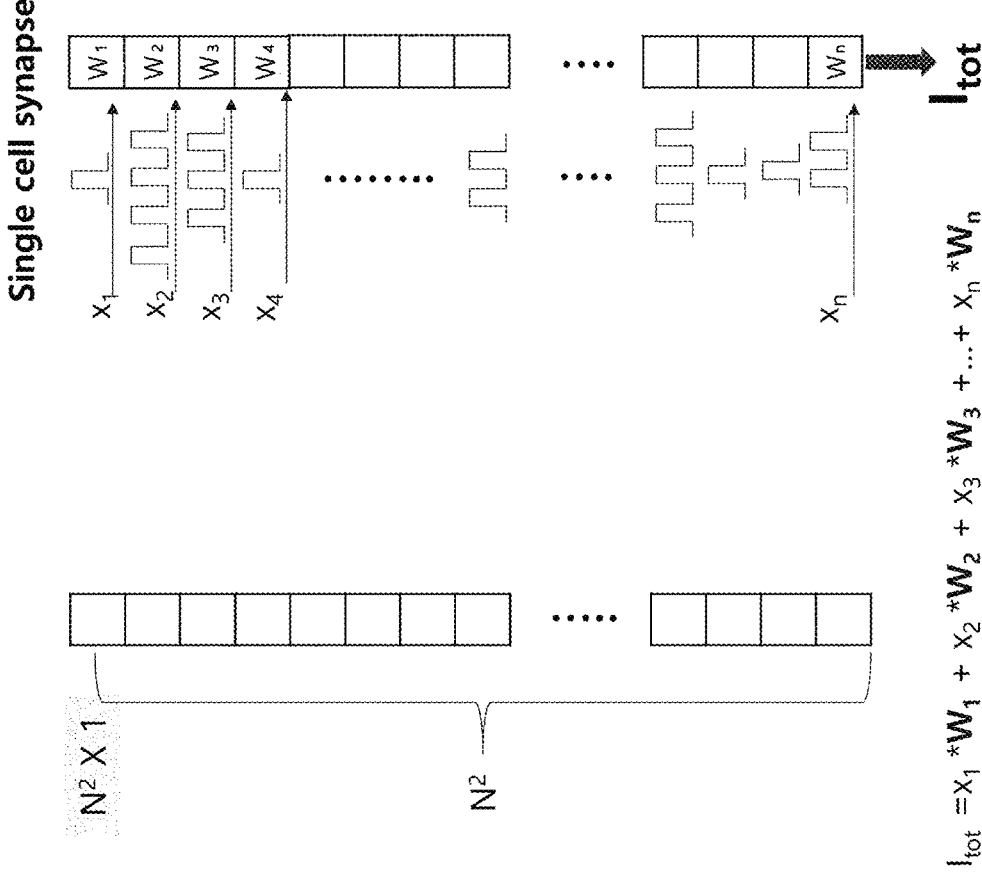
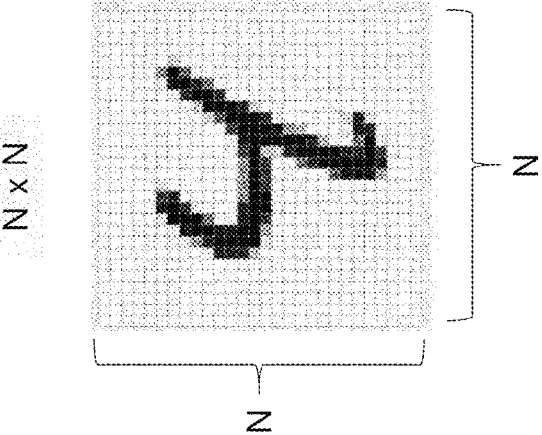
$$I_{tot} = x_1 {}^*W_1 + x_2 {}^*W_2 + x_3 {}^*W_3 + ... + x_n {}^*W_n$$

【Fig. 2】
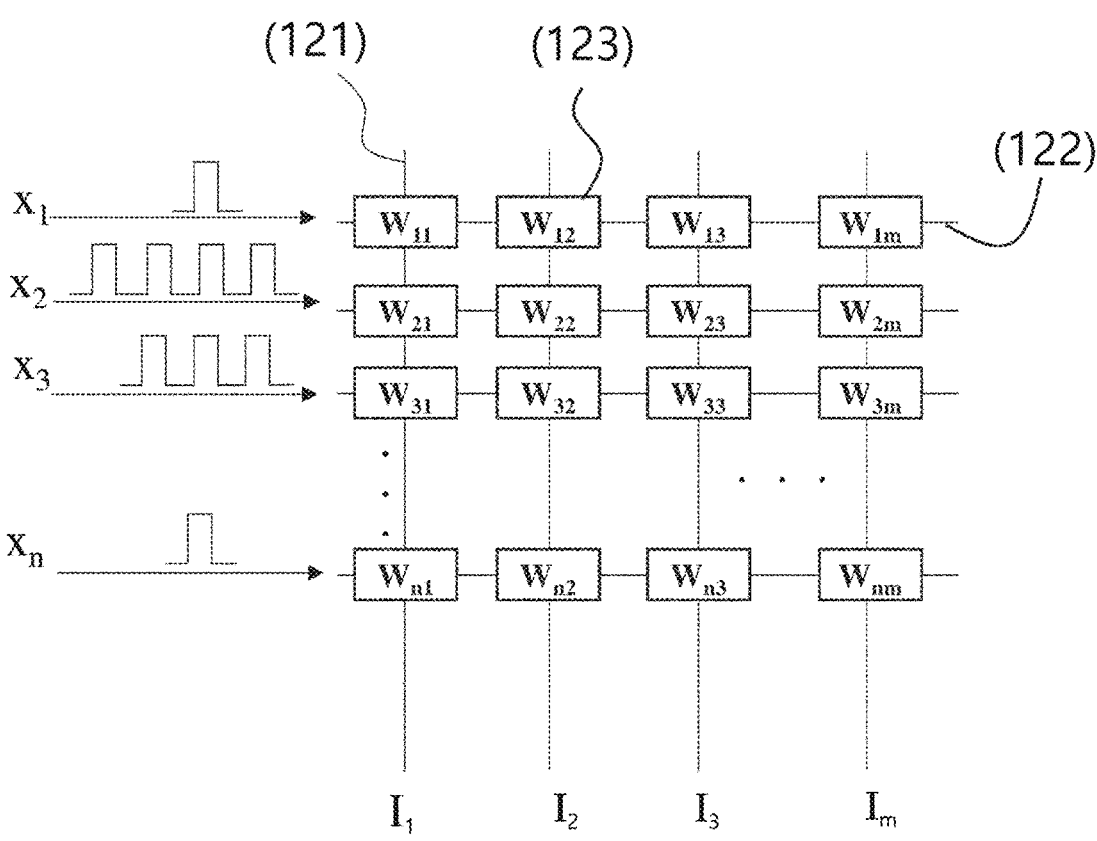
$$I_1 = x_1 * W_{11} + x_2 * W_{21} + x_3 * W_{31} + ... + x_n * W_{n1}$$
$$I_2 = x_1 * W_{12} + x_2 * W_{22} + x_3 * W_{32} + ... + x_n * W_{n2}$$
$$\vdots$$
$$I_m = x_1 * W_{1m} + x_2 * W_{2m} + x_3 * W_{3m} + ... + x_n * W_{nm}$$

【Fig. 3】
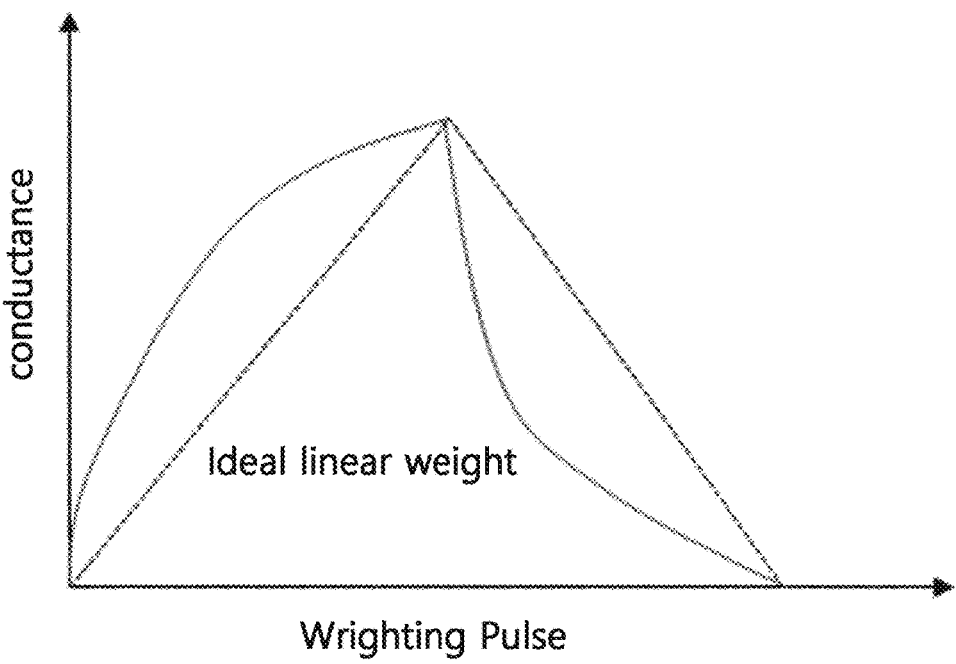
【Fig. 4】
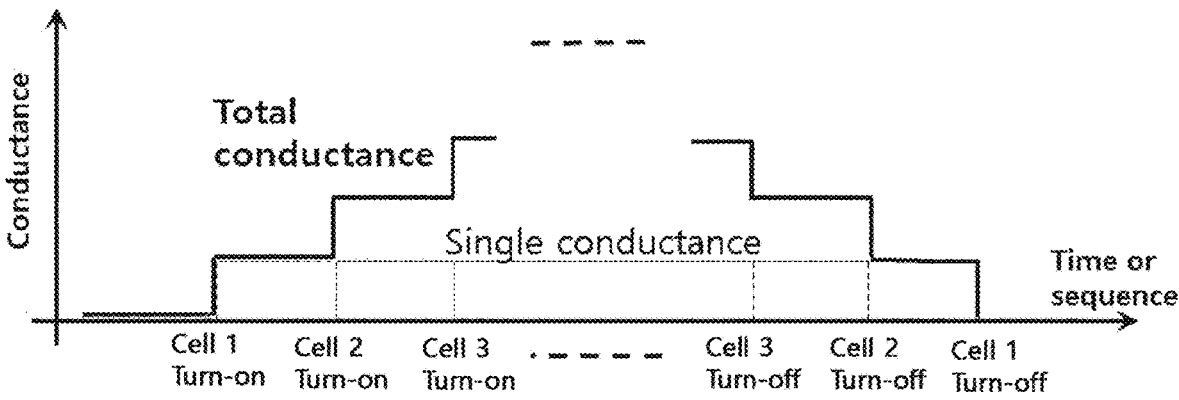

【Fig. 5】
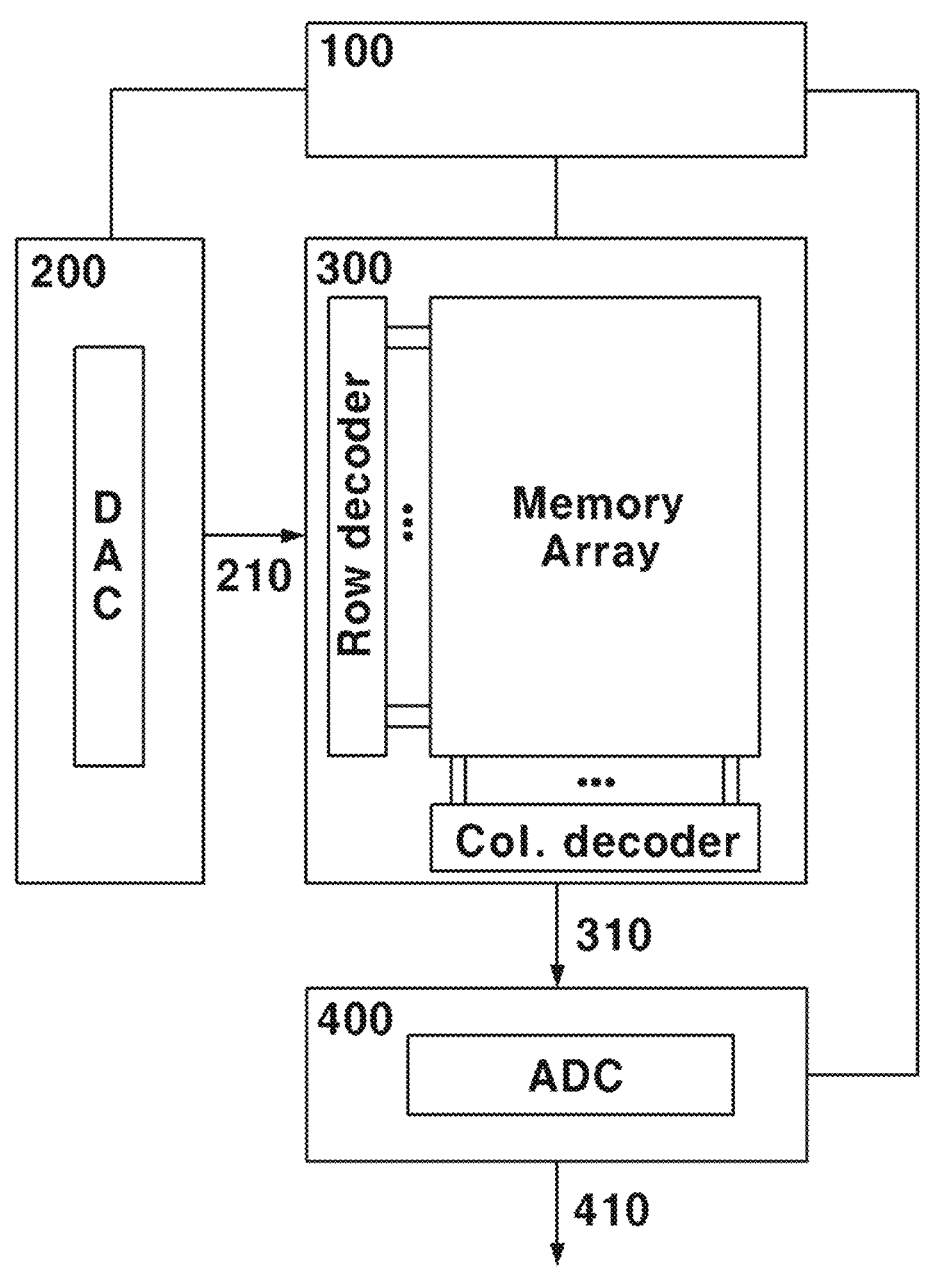

【Fig. 6】
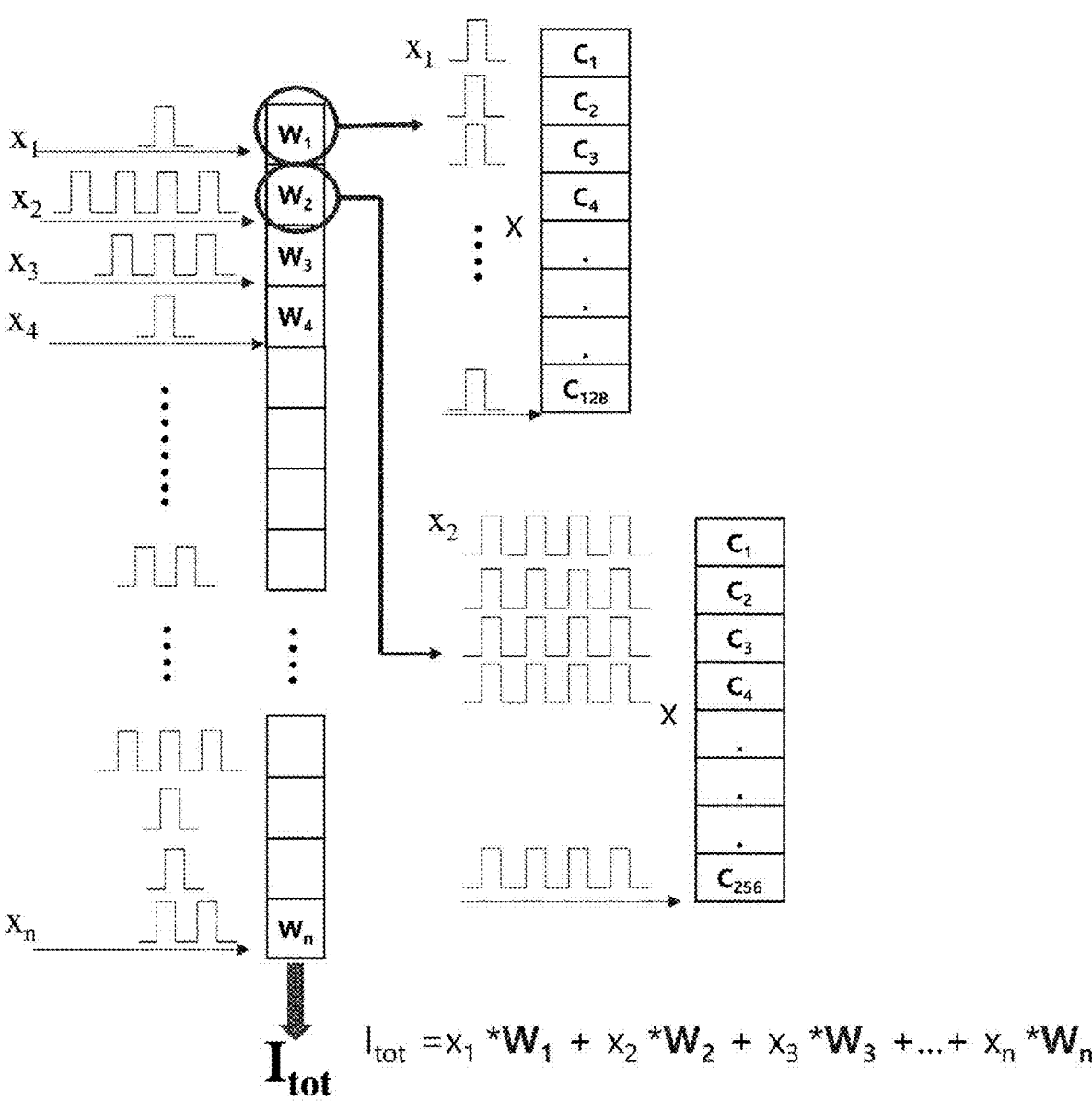
$$I_{tot} = x_1 * W_1 + x_2 * W_2 + x_3 * W_3 + \ldots + x_n * W_n$$

【Fig. 7】
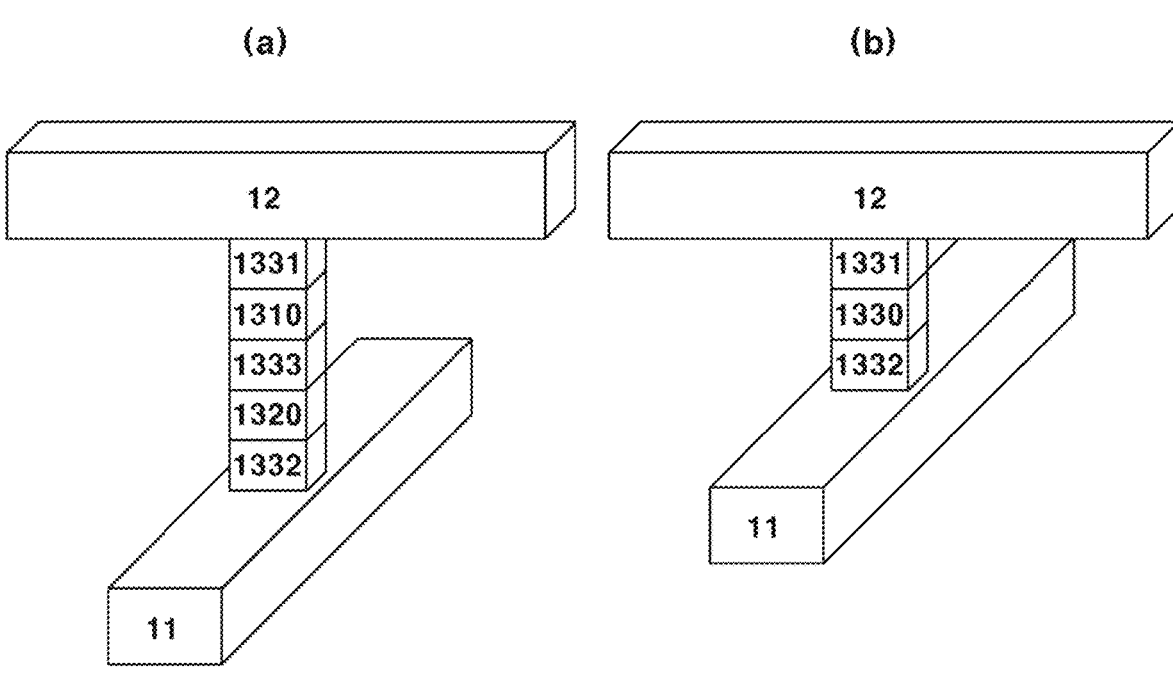
【Fig. 8】
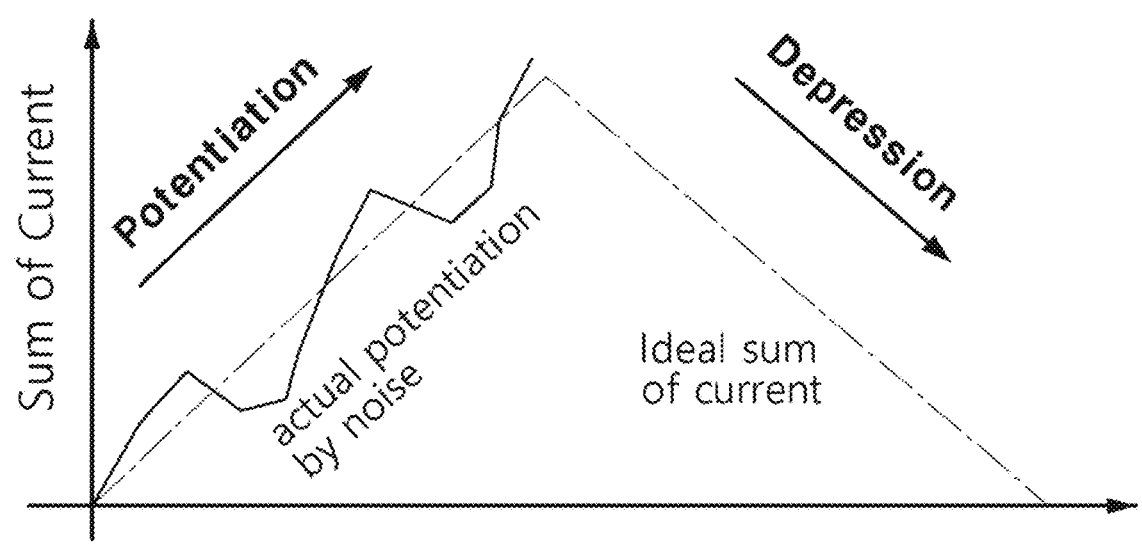

〖Fig. 9〗
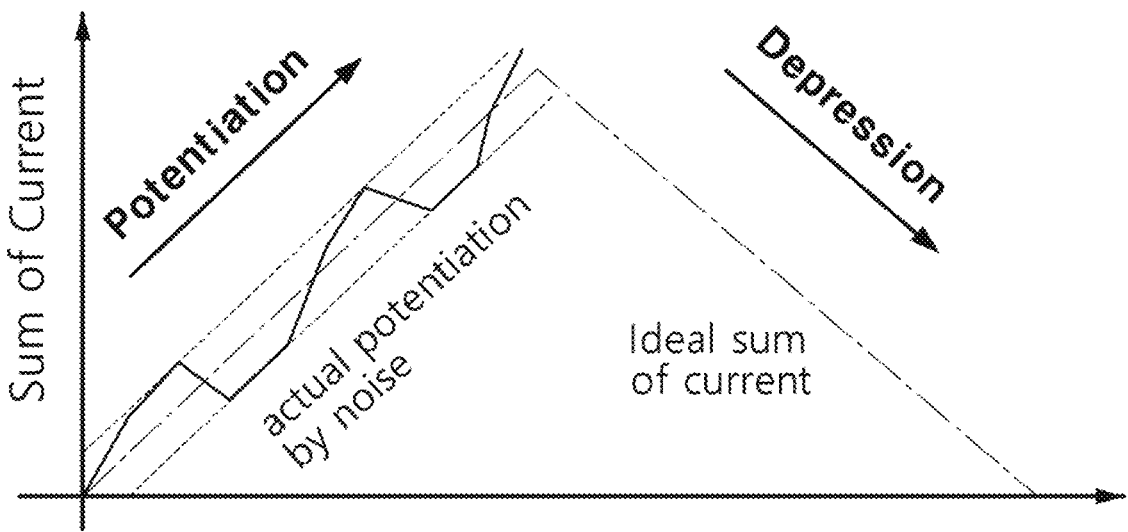
〖Fig. 10〗
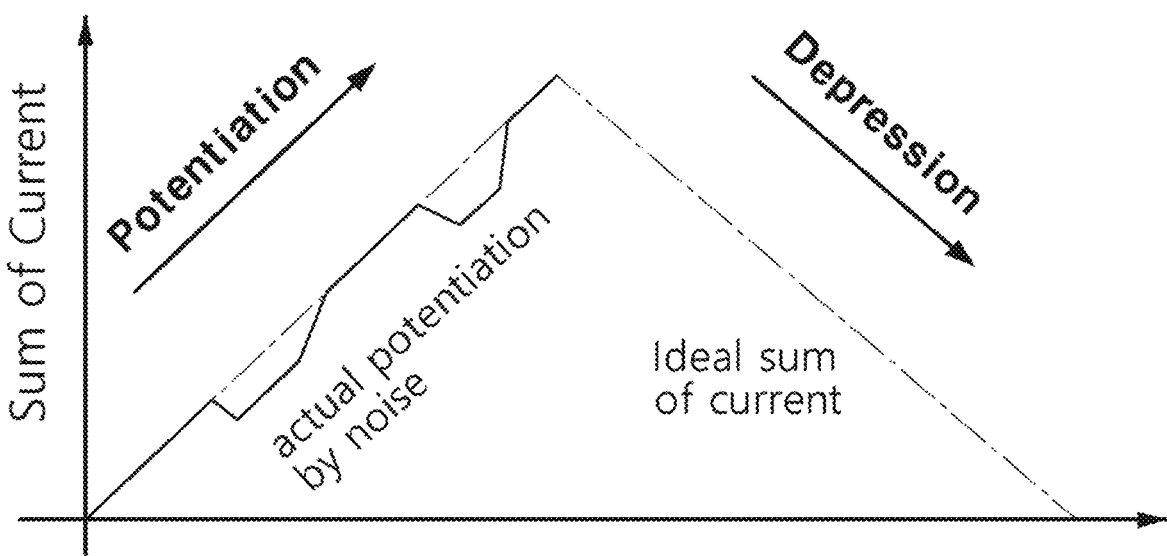

[Fig. 11]
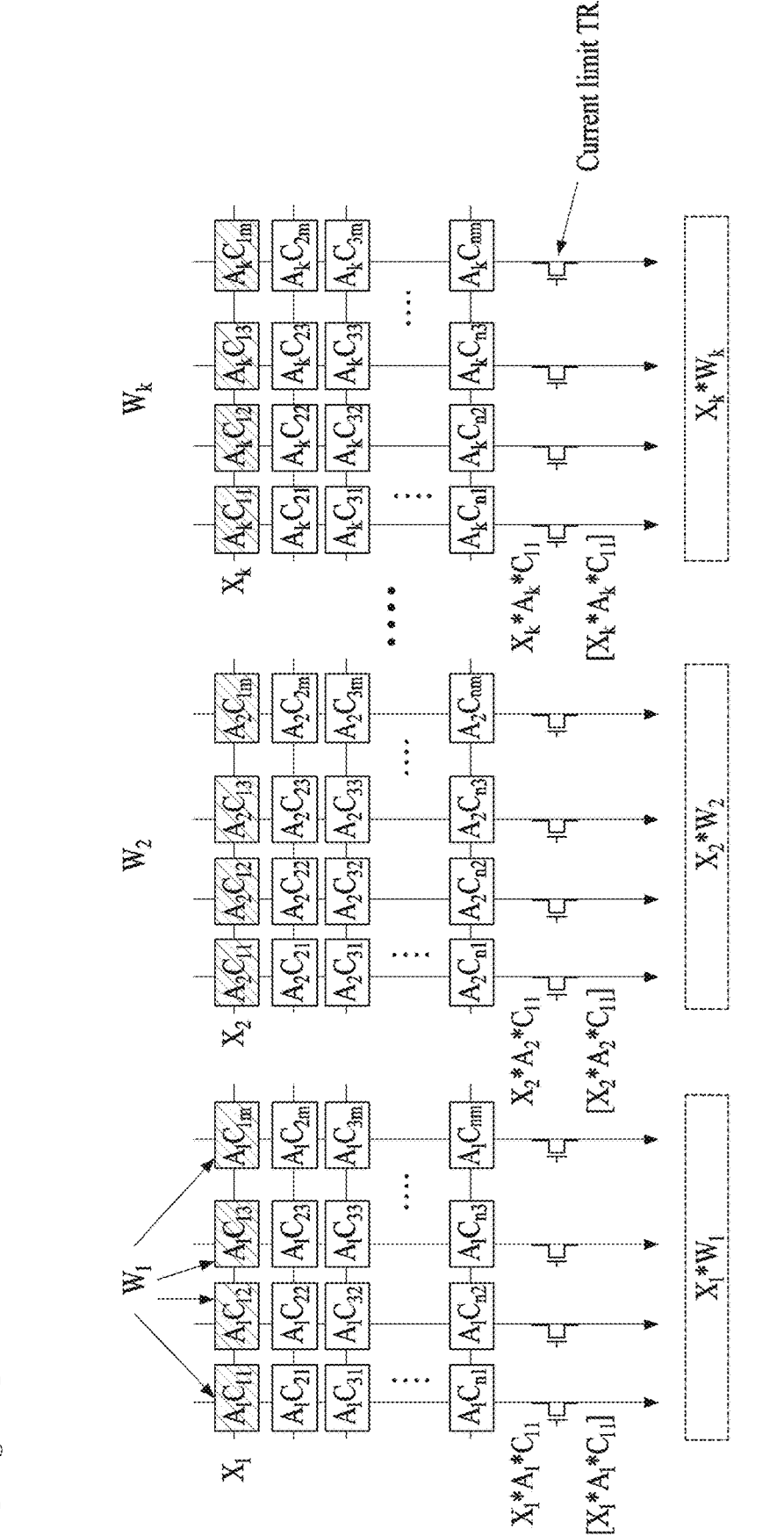

【Fig. 12】
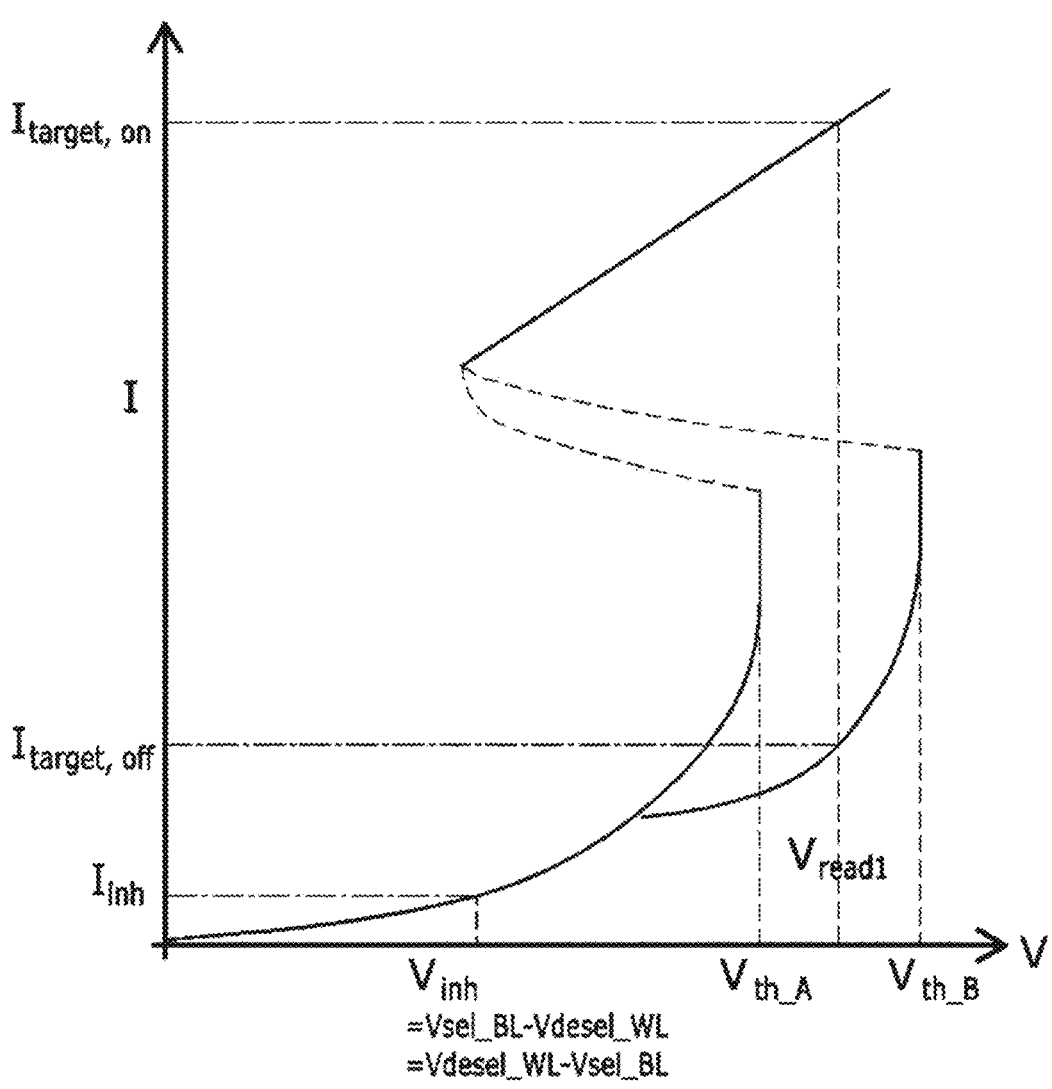

[Fig. 13]
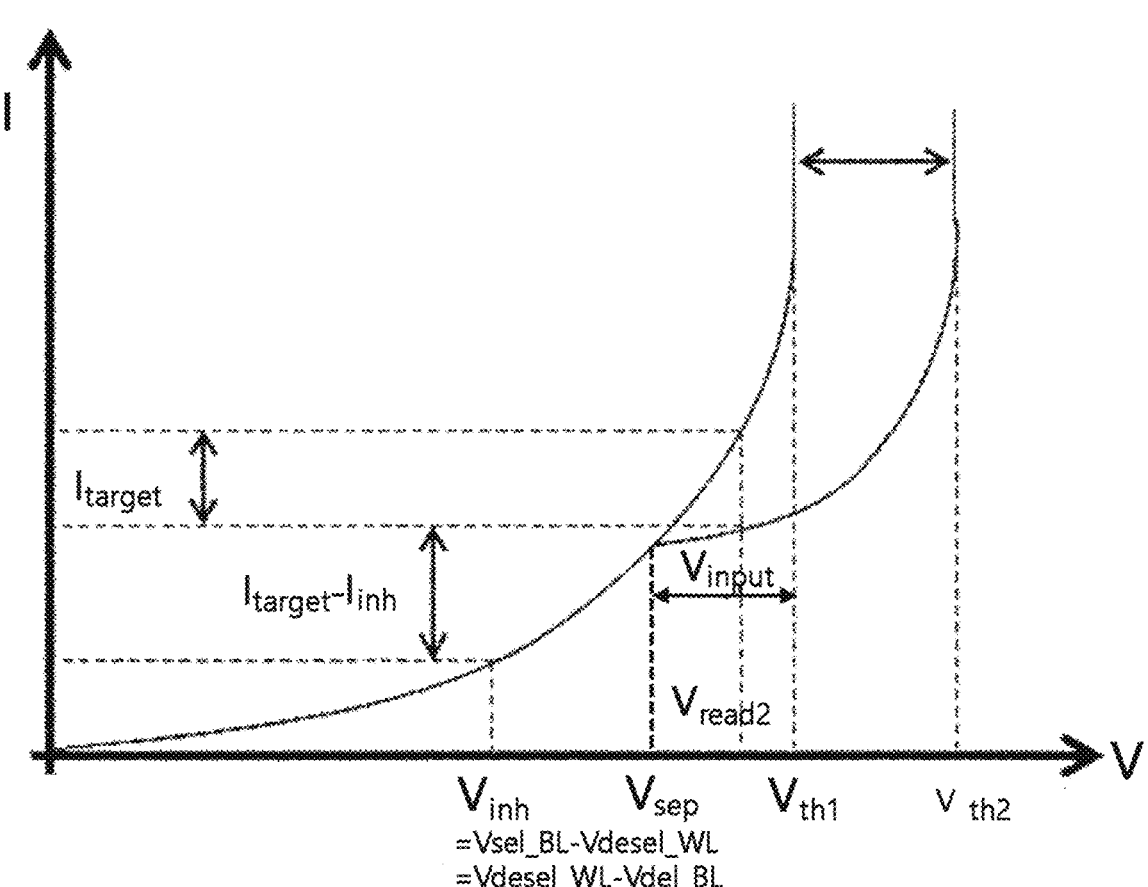

[Fig. 14]
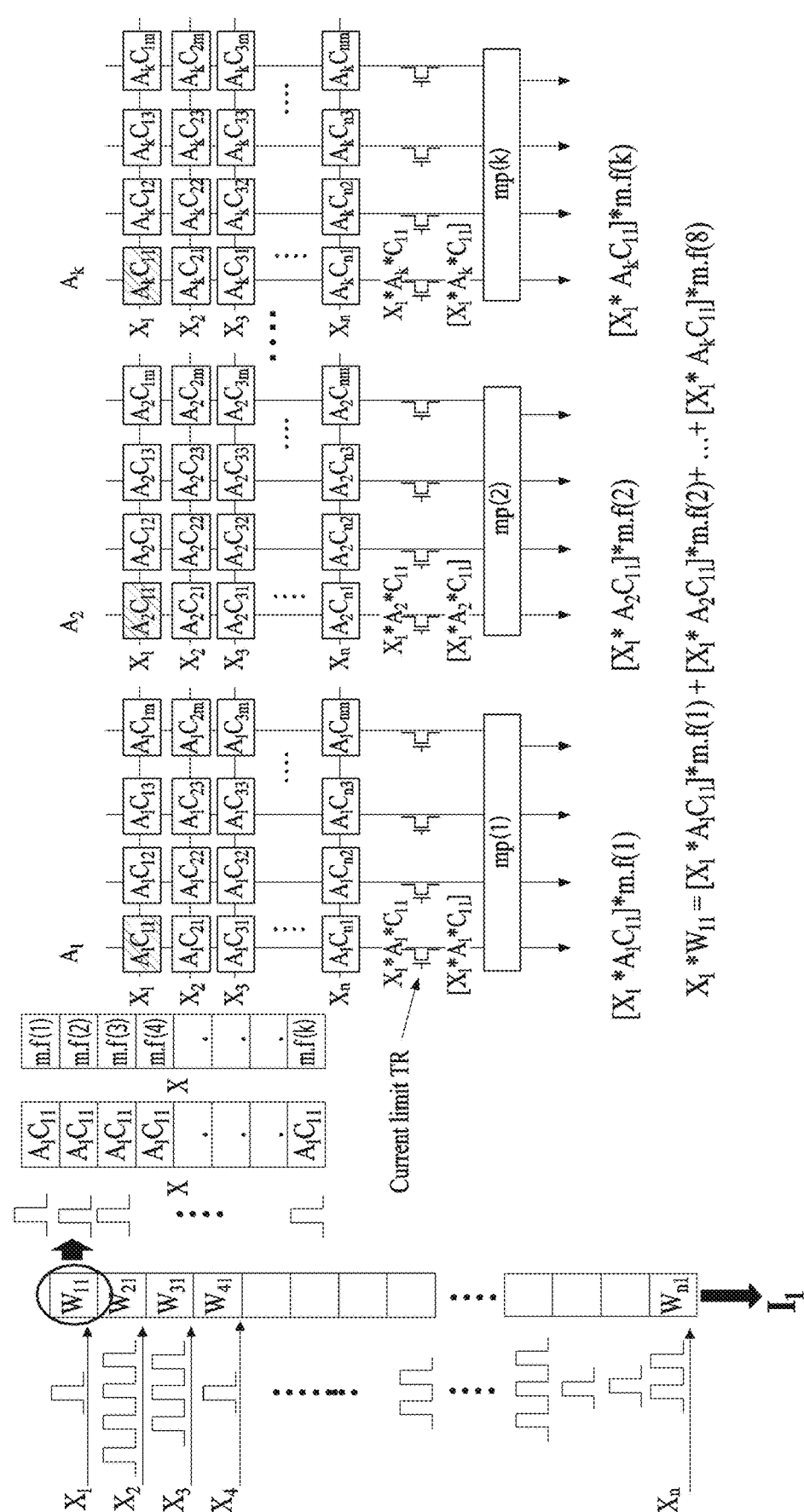

[ Fig. 15]
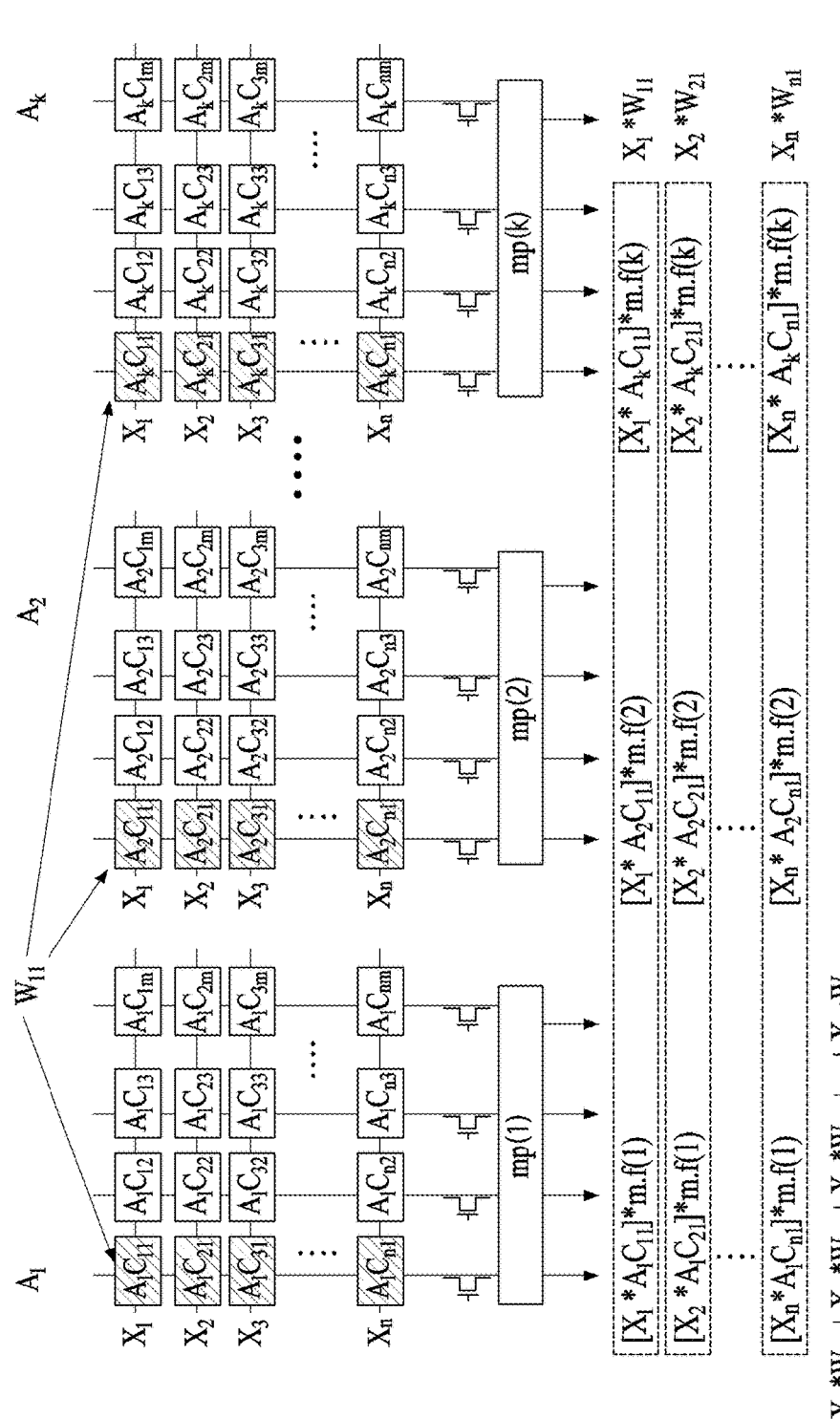

[ Fig. 16 ]
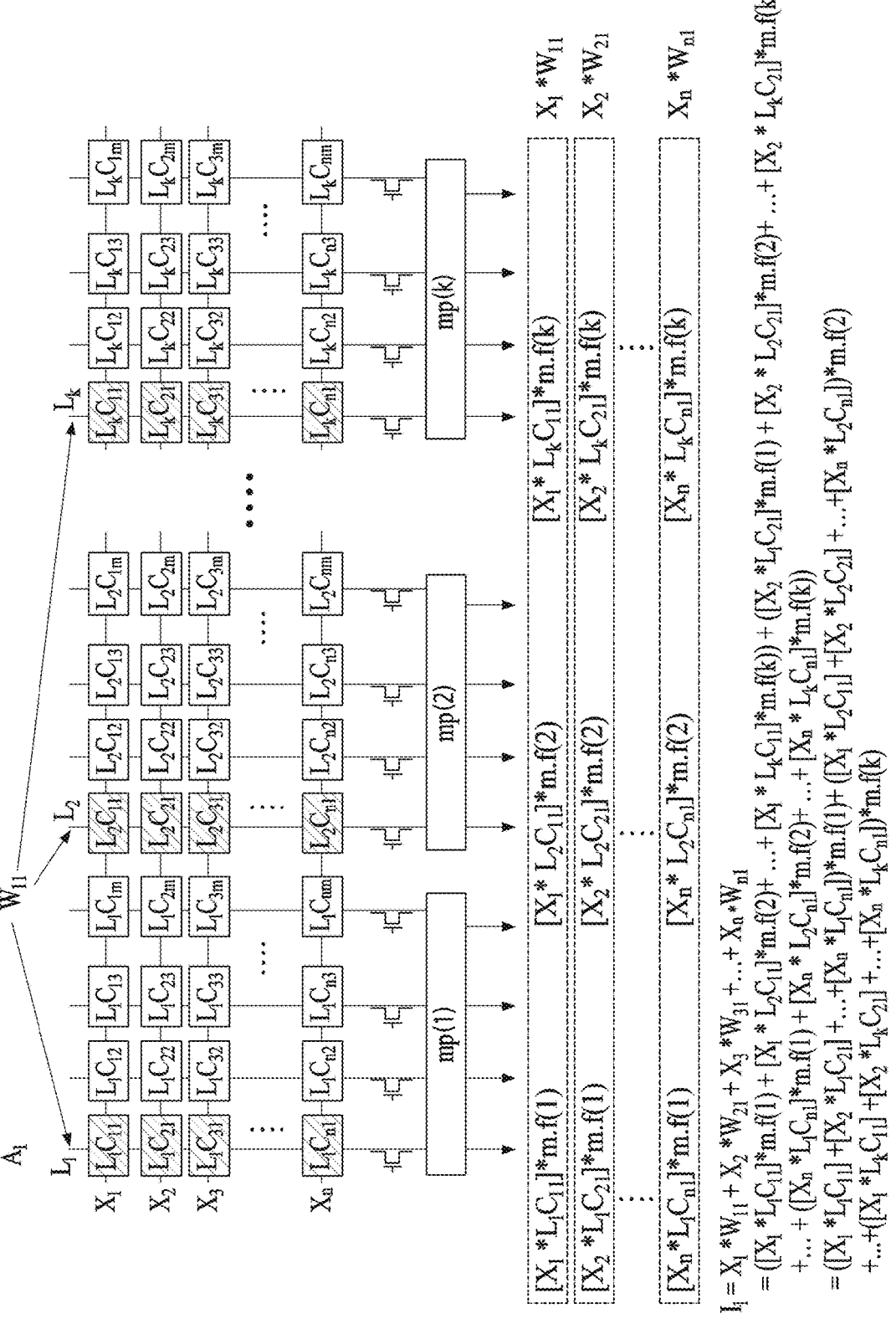

[ Fig. 17]
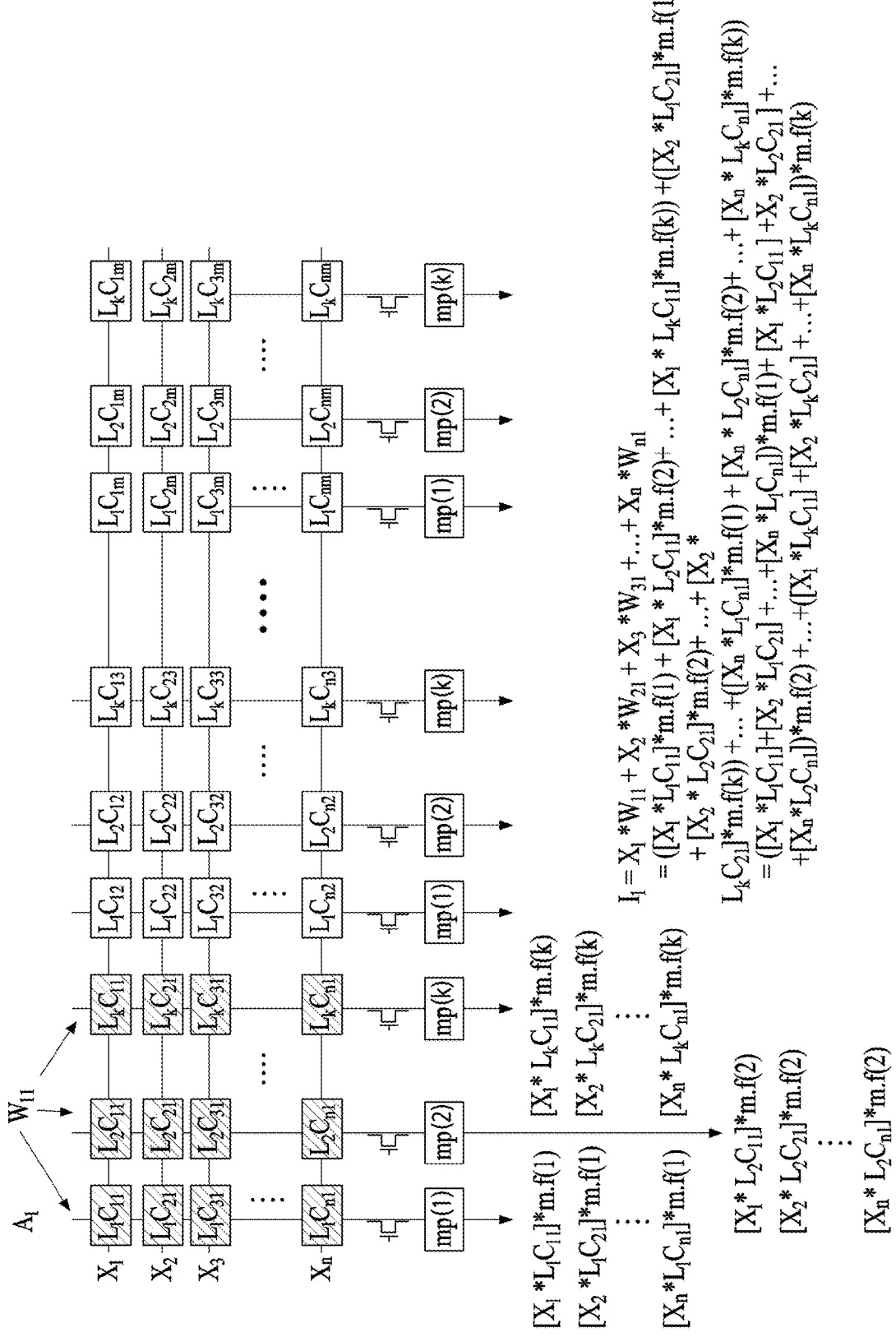

NEUROMORPHIC SYSTEM USING MEMORY ARRAY WITH CROSS-POINT STRUCTURE

TECHNICAL FIELD

The present invention relates to utilizing a memory device capable of controlling a gradual change in resistance in constructing a neuromorphic system. More specifically, the present invention relates to a neuromorphic system in which a plurality of selected memory cells are recognized and operated as one synaptic unit.

BACKGROUND ART

The artificial intelligence semiconductor industry may be said to be in its embryonic stage. In recent years, semiconductor design and manufacturing companies have begun to release prototypes or early products. All of the prototypes or early products are first-generation artificial intelligence semiconductor products based on CMOS, and thus they are no different from existing semiconductor products in terms of memory, and it is expected that new memories will be introduced and used in earnest in second-generation artificial intelligence semiconductors.

For second-generation artificial intelligence semiconductors with a degree of integration similar to that of a biological neural network, an artificial synapse that has all the core characteristics of a biological synapse must be implemented as a single device. In synapses in a biological system, changes in synaptic weights in a process of processing signals transmitted from neurons are involved, and the synapses perform learning and memory functions through the changes. Therefore, an object of an artificial synaptic device is to perform learning and memory functions by mimicking them so that the changes in synaptic weights are expressed as currents (or resistances). Therefore, in order to achieve the object, it is very important to develop a device capable of making a controllable and distinguishable gradual change in current (or resistance). In the most ideal artificial synaptic device, the gradual change in current (or resistance) is a change in current (or resistance) that is exactly proportional to the number of pulses applied.

Various artificial synaptic devices have been suggested and manufactured to achieve the object, and currently, the technology that has been researched in the semiconductor field for synaptic devices is a method for storing information in each cell by distinguishing a low-resistance state from a high-resistance state in a memory array using a device capable of changing resistance such as a RRAM, a PRAM, and an MRAM, and the research has been conducted in the direction of implementing a high change in resistance by an on-off type digital method and reading a logic state of a cell in the memory array according to the change in resistance.

However, for an artificial synaptic device, not only does one device is required to have a very various resistance states, but the resistance states are also required to be controllable. A lot of research and development has been conducted on the artificial synaptic device using the above-described RRAM device, PRAM device, or the like, but the devices have asymmetry or lack of repeatability, and thus, the devices are still far from being able to achieve simultaneous control while creating a discriminative resistance state.

DISCLOSURE OF THE INVENTION

Technical Problem

An object of the present invention is to provide a neuromorphic system including a synaptic unit capable of causing a gradual change in resistance for analog information processing, and an operating method therefor.

Technical Solution

In order to achieve the object described above, according to an aspect of the present invention, there is provided a neuromorphic system including an input signal unit for generating an input signal, a synapse unit including a plurality of synaptic units that receive a signal of the input signal unit and cause a current to flow according to a set weight, an output signal unit for generating an output signal by receiving a current generated from the synapse unit, and a controller unit for controlling the input signal unit, the synapse unit, and the output signal unit, in which the input signal unit includes a digital-to-analog converter (DAC), the synaptic units include a plurality of memory cells that are connected to each other and are each capable of selectively storing a logic state, the plurality of memory cells are arranged in a cross-point structure including an input electrode line and an output electrode line that cross each other to form one or more memory arrays, the output signal unit includes an analog-to-digital converter (ADC), and the controller unit generates an analog input signal through the DAC in the input signal unit, allows the generated analog input signal to be applied to each of the plurality of memory cells included in the synaptic unit so that a current flows, and generates a sum of currents flowing from the plurality of memory cells as the output signal through the ADC in the output signal unit.

Further, according to another aspect of the present invention, there is provided an operating method for a neuromorphic system including an input signal unit for generating an input signal, a synapse unit including a plurality of synaptic units that receive a signal of the input signal unit and cause a current to flow according to a set weight, an output signal unit for generating an output signal by receiving a current generated from the synapse unit, and a controller unit for controlling the input signal unit, the synapse unit, and the output signal unit, where the input signal unit includes a digital-to-analog converter (DAC), the synaptic units include a plurality of memory cells that are connected to each other and are each capable of selectively storing a logic state, the plurality of memory cells are arranged in a cross-point structure including an input electrode line and an output electrode line that cross each other to form one or more memory arrays, and the output signal unit includes an analog-to-digital converter (ADC), the operating method including a step (a) of generating an analog input signal through the DAC of the input signal unit, a step (b) of applying the input signal to the plurality of memory cells of the synaptic unit, and a step (c) of generating a sum of the currents flowing from the plurality of memory cells of the synaptic unit by the applied input signal as the output signal through the ADC of the output signal unit.

Advantageous Effects

According to the present invention, it is possible to provide a new neuromorphic system with high accuracy, small size, and low power consumption.

BRIEF DESCRIPTION OF THE DRAWINGS

FIG. 1 is a diagram illustrating a vector-matrix multiplication (VMM) operation.

FIG. 2 is a diagram illustrating VMM operation through a memory array with a cross-point structure.

FIG. 3 is a diagram illustrating a change in conductance of a non-volatile memory device in the related art according to a writing pulse.

FIG. 4 is a diagram illustrating a change in conductance according to the number of memory cells in an on-state in the present invention.

FIG. 5 is a configuration diagram of a neuromorphic system according to an embodiment of the present invention.

FIG. 6 is a diagram illustrating a method for measuring currents in units of synaptic units according to an embodiment of the present invention.

FIG. 7 is a diagram illustrating the structure of a memory cell according to an embodiment of the present invention.

FIG. 8 is a diagram illustrating a change in current according to an embodiment of the present invention.

FIG. 9 is a diagram illustrating a change in current according to an embodiment of the present invention.

FIG. 10 is a diagram illustrating a change in current according to an embodiment of the present invention.

FIG. 11 is a diagram illustrating a method for measuring currents in units of synaptic units according to an embodiment of the present invention.

FIG. 12 is a diagram illustrating a method for reading a memory cell including a two-terminal switching device in the related art.

FIG. 13 is a diagram illustrating a method for reading a memory cell including a two-terminal switching device according to an embodiment of the present invention.

FIG. 14 is a diagram illustrating an operating method for a neuromorphic system according to an embodiment of the present invention.

FIG. 15 is a diagram illustrating an operating method for a neuromorphic system according to an embodiment of the present invention.

FIG. 16 is a diagram illustrating an operating method for a neuromorphic system according to an embodiment of the present invention.

FIG. 17 is a diagram illustrating an operating method for a neuromorphic system according to an embodiment of the present invention.

MODE FOR CARRYING OUT THE INVENTION

Hereinafter, a configuration and operation according to embodiments of the present invention will be described with reference to the accompanying drawings. In the following description of the present invention, if it is determined that the detailed description of the known function or configuration related to the present invention may unnecessarily obscure the subject matter of the present invention, the detailed description thereof will be omitted. In addition, when a part "includes" an element, unless described to the contrary, the term "includes" does not indicate that another element is excluded but instead indicates that the other element may be further included.

In the present invention, a new neuromorphic system and operating method for the neuromorphic system will be described.

In deep learning algorithms, the vector-matrix multiplication (VMM) operation is a key computing operation for learning and inference.

Describing a VMM method for recognizing an image with reference to FIG. 1, the image is divided into N×N regions, a weight is set for each of the regions, and information such as contrast is input as various input signals. Expressing this as a neuromorphic system, an input signal $X_i$ is a signal from a pre-neuron, an output current $I_{tot}$ is an output signal to a post-neuron, and $W_i$ is a weight by which the input signal is multiplied through a synapse. In this way, the current $I_{tot}$ expressed through a sum of products of the input signal and the weight is compared with a reference value, and the image is recognized by finding a synapse with the closest weight.

However, there are many problems in performing such an operation in an existing computing system, such as power consumption and device size.

In order to solve the problems, in recent years, studies using cross-point structures using new memories such as a resistive random access memory (RRAM), a phase change random access memory (PRAM), a magnetoresistive random access memory (MRAM), and a ferroelectric random access memory (FeRAM), which are non-volatile memories, have been actively conducted.

A memory array with the cross-point structure has a structure in which input electrode lines and output electrode lines cross each other, and the input electrode lines and the output electrode lines are connected through memory cells at the crossing points where they cross each other.

The VMM through the memory array with the cross-point structure is described in FIG. 2. In FIG. 2, when an input signal, which may be expressed as a vector $X_i$, is applied to row metal lines 122 while keeping column metal lines 121 grounded, a current flowing through each memory cell at a position of a cross-point (i, j) in is $X_iW_{ij}$. Since the current flowing in the column lines 121 is the sum of the currents flowing in memories positioned in the in the in the same column line 121, $I_j = X_1{}^*W_{1j} + X_2{}^*W_{2j} + X_3{}^*W_{3j} + \ldots + X_n{}^*W_{nj}$ (j is 1 to m in FIG. 2).

An inference process is performed by comparing each of the m currents $I_1$ to $I_m$ output through the column lines 121 in this way with a reference value.

Here, the input signal $X_i$ is an analog signal and may be a pulse with a constant width and different heights, a pulse with a constant height and different widths, or a pulse with constant width and height and different numbers. Further, the weight $W_{ij}$ may be expressed through conductance of the memory cell at each point of the memory array with the cross-point structure.

Incidentally, here, the weight $W_{ij}$ corresponds to the conductance of the memory cell, and in order to increase the accuracy of the inference, it is necessary to store various values, that is, various conductances, in stages in the memory cell. Since the accuracy of inference increases as the variety increases, development of new memories capable of storing conductances of various stages has been actively made, but satisfactory results have not yet been obtained.

This is shown in FIG. 3, where when the conductance is measured as a writing pulse is increased to change the conductance corresponding to a synaptic weight in the memory cell such as the RRAM, the conductance of the memory cell changes, but the change is curved, rather than linear. Moreover, the curve does not repeatedly show the same curve and continues to change. That is, for the synaptic unit using a memory cell such as a single RRAM, the conductance of the memory cell corresponding to the weight not only does not increase or decrease linearly, but also changes each time the change in conductance is measured, and as a consequence, it is not practically possible to increase the accuracy of inference.

In order to overcome this drawback, attempts have been made to control the change in conductance of the memory cell through peripheral circuits so that the change is easy to infer, but this not only complicates the neuromorphic system and slows down the computation speed, but also does not control the change to a satisfactory level.

In order to improve the problems in the related art, the present invention provides a new neuromorphic system capable of exhibiting various changes in conductance by using a plurality of memory cells, rather than one memory cell, as a synaptic unit, and an operating method using the same. In the present invention, by using a plurality of memory cells, rather than one memory cell, as the synaptic unit, it is possible to express the weight of the synaptic unit in various ways through a linear and predictable change in resistance.

As shown in FIG. 4, the conductance of the synaptic unit may be gradually changed according to the increase and decrease of the number of on-cells, that is, low-resistance memory cells among a plurality of memory cells included in the synaptic unit, where the change is linear and predictable.

Describing it in more detail, in the present invention, there may be provided a neuromorphic system including an input signal unit for generating an input signal, a synapse unit including a plurality of synaptic units that receive a signal of the input signal unit and cause a current to flow according to a set weight, an output signal unit for generating an output signal by receiving a current generated from the synapse unit, and a controller unit for controlling the input signal unit, the synapse unit, and the output signal unit, in which the input signal unit includes a digital-to-analog converter (DAC), the synaptic units include a plurality of memory cells that are connected to each other and are each capable of selectively storing a logic state, the plurality of memory cells are arranged in a cross-point structure including an input electrode line and an output electrode line that cross each other to form one or more memory arrays, the output signal unit includes an analog-to-digital converter (ADC), and the controller unit generates an analog input signal through the DAC in the input signal unit, allows the generated analog input signal to be applied to each of the plurality of memory cells included in the synaptic unit so that a current flows, and generates a sum of currents flowing from the plurality of memory cells as the output signal through the ADC in the output signal unit.

The neuromorphic system according to the present invention is shown in FIG. 5. The controller unit 100 controls the operation of an input signal unit 200, an output signal unit 400, and a synapse unit 300, and the input signal unit 200 generates an input signal capable of reading a logic state stored in a memory cell of a memory array with a cross-point structure included in the synapse unit 300. The output signal unit 400 receives current flowing from a plurality of memory cells of the synapse unit 300 and generates the current as an output signal through the ADC. The synapse unit 300 includes a plurality of memory cells including a memory array with a cross-point structure. In FIG. 5, only one memory array included in the synapse unit 300 is shown, but there may be two or more memory arrays.

In the present invention, each synaptic unit includes a plurality of memory cells arranged in a memory array with a cross-point structure. The memory array with the cross-point structure has input electrode lines and output electrode lines which cross each other, and the memory cells are disposed and connected at points where they cross each other. A memory cell may store a logic state through a change in resistance and thus store a changing weight. Since the synaptic unit includes a plurality of memory cells, various weights required for the synapse unit for accurate inference may be expressed through the change in resistance in the plurality of memory cells.

The number of a plurality of memory cells set as one synaptic unit may be determined according to a set weight. For example, in a case where a memory cell is capable of storing a logic state of one bit, when a synaptic weight of 128 is required, 128 memory cells are selected to form one synaptic unit, and when the selected 128 memory cells are turned on, the synaptic weight of 128 is set. Likewise, when a synaptic weight of 256 is required, the synaptic weight of 256 may be set by using 256 memory cells.

Further, the number of memory cells set as one synaptic unit is preferably $2^n$ based on the binary system based on the computer. Accordingly, the number of selected memory cells may be variously provided, such as 1, 2, 4, 8, 16, 32, 64, 128, 256, 1024, or 2048 as needed.

Describing this in more detail through FIG. 6, when the input signal of $X_1$ is applied to the synaptic unit $W_1$ and a weight of 128 is set in the synaptic unit $W_1$, 128 cells $C_1$ to $C_{128}$ are turned on for the synaptic weight for $W_1$, the input signal of $X_1$ is applied to the 128 cells, and currents flowing from the plurality of memory cells output therefrom are summed and transmitted to the output signal unit.

Likewise, when the input signal of $X_2$ is applied to the synapse $W_2$ and a weight of 256 is set in the synapse $W_2$, 256 cells $C_1$ to $C_{256}$ are turned on for the synaptic weight for $W_2$, the input signal of $X_1$ is applied to the 256 cells, and currents output therefrom are measured. The output signal may be determined according to various synaptic weights through the sum of currents flowing simultaneously in several memory cells.

In the present invention, the input signal unit includes the digital-to-analog converter (DAC) to convert information such as a digitized image into an analog input signal. As described above, for the operation of the VMM method, the input signal is an analog signal and may be a pulse with a constant width and different heights, a pulse with a constant height and different widths, or a pulse with constant width and height and different numbers. In order to generate such a signal, a DAC device capable of converting digital information received from a measuring device into an analog signal is required.

In addition, the output signal unit includes the analog-to-digital converter (ADC), which enables the analog current signal transmitted from the synapse unit to be converted into a digital signal. Accordingly, the output signal generated through the output signal unit may include a digital signal. However, the generated output signal may not always be digitized, so the output signal may be an analog signal.

Meanwhile, the plurality of memory cells of the synaptic unit may be arranged in various forms in the memory array with the cross-point structure, and all of the memory cells may be arranged on one same input electrode line or on one same output electrode line, or positioned on a plurality of input electrode lines and output electrode lines, for example, a 16×16, 8×32, or 4×64 matrix. Also, the memory cells may be distributed and arranged in a plurality of memory arrays.

In particular, the memory cells of the synaptic unit may include a non-volatile memory device and a two-terminal switching device as a selection device enabling cell selection. In order to store logic states in the memory cells with low power, the use of the non-volatile memory is required, and in order to change the resistance state by sequentially selecting memory cells of the synaptic unit and measure the current flowing through the changing, each memory cell is required to include the selection device.

The non-volatile memory device may be any one of a flash memory, a resistive random access memory (RRAM), a phase change random access memory (PRAM), a magnetoresistive random access memory (MRAM), and a ferroelectric random access memory (FeRAM), or a selective-memory. In particular, the non-volatile memory device may be a variable resistance device such as a RRAM, a PRAM, an MRAM, or a selective-memory, and such a variable resistance device may exhibit various resistance states according to applied voltage and/or current pulses, which makes it possible to store logic states of one bit or more.

In addition, the selection device may be a two-terminal switching device, and by applying the two-terminal switching device as the selection device for selecting memory cells in this way, it is possible to increase the degree of integration and reduce power consumption. The two-terminal switching device may be a device such as an ovonic threshold switch, a transition metal oxide switch, a mixed ion-electron conductor (MIEC) switch, a complementary resistance switch, or doped amorphous silicon. The two-terminal switching device has a characteristic of exhibiting a large change in resistance based on a constant voltage, that is, a threshold voltage, which makes it possible to select a cell in the memory array with the cross-point structure.

Further, in the present invention, the plurality of memory cells of the synaptic unit may include a selective-memory device capable of simultaneously performing a function of storing logic states and a function of selecting cells.

The selective-memory device refers to a device having both non-volatile memory characteristics and selection device characteristics. This means that the selective-memory device is able to store logic states by the change in resistance and at the same time, operate as the selection device by causing the change in resistance based on a constant voltage, that is, a threshold voltage.

For example, for the ovonic threshold switch, which contains a chalcogenide material, different resistance states may be generated when a writing voltage is applied with different polarities, and logic states using the generated resistance states may be stored and read. Accordingly, the chalcogenide material without phase change may also be a variable resistance device and at the same time, have a unique switch characteristic, that is, a characteristic in which a constant change in resistance occurs before and after the threshold voltage.

As such, when the variable resistance device containing the chalcogenide material without phase change, such as the ovonic threshold switch device, is used, one or be selected through switch more memory cells may characteristics and a logic state may be stored in each of the memory cells through variable resistance characteristics.

Such a device may be expressed as a selective-memory device, and in this case, since an additional memory device or a selection device is not required, it is possible to increase the density of the memory device and reduce power consumption. For the chalcogenide materials, an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, a Si—Ge—As—Se alloy, a Si—Te—As—Ge alloy, an In—Sb—Te alloy, an In—Sb—Se alloy, an In—Ge—As alloy, an In—Ge—Te alloy, an In—Te alloy, or the like may be used. However, the chalcogenide material is not particularly limited to the above materials, and any material may be used as long as it is capable of storing a logical state by the change in resistance and performing a switching function.

An example of the above-described memory cell is shown in FIG. 7, but for reference, the shape and configuration of each memory cell may be variously modified. For example, the selection device or the memory device may be omitted, or an electrode may be omitted. Alternatively, positions of the selection device and the memory device may be interchanged.

FIG. 7(a) illustrates a memory cell including a memory device and a selection device. A word line 11, which is one of the access lines to the memory cell, runs perpendicular to the page and a bit line 12 runs parallel to the page. A memory cell 13 is disposed between the word line 11 and the bit line 12 that vertically cross each other. Electrodes 1331 and 1332 are disposed between the word line 11 and a memory device 1310 connected thereto and between the bit line 12 and a selection device 1320 connected thereto. Between the electrodes 1331 and 1332, the memory device 1310, the selection device 1320, and an electrode 1333 connecting them are included. The memory device 1310 of the memory cell 13 is any one of non-volatile memory devices such as a flash memory, a RRAM, a PRAM, an MRAM, a FeRAM, and a selective-memory, and the selection device 1320 may be a two-terminal switch device. For example, the memory device 1310 may be any one of a RRAM, a PRAM, an MRAM, a FeRAM, and a selective-memory, and the selection device 1320 may be a two-terminal switch device. In this case, the two-terminal switch element may be an ovonic threshold switch.

Further, the memory cell 13 may include only the selective-memory device without the selection device. FIG. 7(b) illustrates an example in which the memory cell 13 includes the selective-memory device 1330 and the electrodes 1331 and 1332. The selective-memory device 1330 may be a chalcogenide material without phase change because when the chalcogenide material is used, it is possible to select a memory cell using a unique switch characteristic and write a logic state using a variable resistance characteristic that appears according to a writing condition. An example of such a selective-memory device 1330 may be an ovonic threshold switch device containing a chalcogenide material. This is because, although the ovonic threshold switch device is generally used as the selection device in connection with a RRAM, a PRAM, or the like, the ovonic threshold switch device may be used alone to exhibit variable resistance characteristics and perform the function of selecting at the same time. The chalcogenide material may be an alloy containing In—Ge—As—Se.

In the neuromorphic system according to the present invention, a current control means for controlling passing currents within a predetermined range is connected to the plurality of memory cells of the synaptic unit so that the currents flowing from the plurality of memory cells by the input signal may pass through the current control means and flow as a current controlled to the predetermined range and a sum of currents flowing through the current control means may be generated as the output signal through the ADC in the output signal unit.

The change in the currents passing through the plurality of memory cells of the synaptic unit by the input signal is relatively constant, but as shown in FIG. 8, a current higher or lower than an expected current may be shown in the middle due to a cell distribution, or an increasing slope of the total current may be made to deviate from an ideal slope. This phenomenon is undesirable because it may be an error factor in a final output signal. Therefore, in order to control the phenomenon, in the present invention, the current control means for controlling a flowing current within a predetermined range may be connected to the memory cell to remove the current that greatly deviates from the ideal current slope upwards and downwards as shown in FIG. 9, thereby increasing the accuracy of the output signal.

The current control means may be various types of circuits or devices, and may be, for example, a current limit transistor connected to an end of an output electrode line of the memory array with the cross-point structure. As shown in FIG. 10, the current limit transistor limits a high current outside a predetermined range to the predetermined range or less. Therefore, while the current from the memory cell flows through the transistor before flowing into the output signal unit, a current of a certain level or above may be limited.

A more detailed example is illustrated in FIG. 11, where input signals $X_1$, $X_2$, $X_3$, . . . , $X_k$ are applied to respective synaptic units $W_1$, $W_2$, $W_3$, . . . , $W_k$, each synaptic unit is configured with m memory cells, and transistors are connected to ends of output electrode lines of each memory array as the current control means. Accordingly, the current finally flowing by the input signals is $I_{tot}$=$X_1$*$W_1$+$X_2$*$W_2$+$X_3$*$W_3$+ . . . +$X_k$*$W_k$=([$X_1$*$A_1C_{11}$]+[$X_1$*$A_1C_{12}$]+ . . . +[$X_1$*$A_1C_{1m}$])+([$X_2$*$A_2C_{11}$]+[$X_2$*$A_2C_{12}$]+    .    .    . +[$X_2$*$A_2C_{1m}$])+ . . . +([$X_k$*$A_kC_{11}$]+[$X_k$*$A_kC_{12}$]+ . . . +[$X_k$*$A_kC_{1m}$]), where $A_1C_{11}$ refers to a $C_1$ cell of an $A_1$ array and [$X_1$*$A_1C_{11}$] refers to a compliance current obtained by limiting the current flowing when the input signal $X_1$ passes through the $A_1C_{11}$ cell to a current of a certain level or less through a transistor (a current limit TR) disposed at the end of the output electrode line of the memory array. The sum of the compliance currents is generated as the output signal through the ADC in the output signal unit.

In the above example, the plurality of memory cells of the synaptic unit are positioned on the same input electrode line in one memory array, but the present invention is not necessarily limited thereto and the plurality of memory cells of the synaptic unit may be positioned on two input electrode lines, on one output electrode line, or on a 16×16, 8×32, or 4×64 matrix, within the memory array.

In order to operate the neuromorphic system as described above, according to the present invention, there is provided an operating method for the neuromorphic system including: a step (a) of generating an analog input signal through the DAC of the input signal unit, a step (b) of applying the input signal to the plurality of memory cells of the synaptic unit, and a step (c) of generating a sum of the currents flowing from the plurality of memory cells of the synaptic unit by the applied input signal as the output signal through the ADC of the output signal unit.

Further, in the neuromorphic system, when a current control means is connected to the plurality of memory cells of the synaptic unit, in the step (c), the currents flowing from the plurality of memory cells pass through the current control means and flow as currents limited to the predetermined range and a sum of the controlled currents is generated as the output signal through the ADC in the output signal unit.

In particular, when the plurality of memory cells use two-terminal switching devices as the selective memory device capable of performing both the function of storing the logic state and the function of selecting the cell or the selection device for the function of selecting the cell, and in the step (b), a voltage of the applied input signal may be in a range in which all of the plurality of memory cells are not turned on and in a range in which resistance states of the plurality of memory cells are distinguishable.

A general cell selection process using the switching function in the memory array with the cross-point structure as in the present invention is performed by allowing only a very low current to flow in unselected cells using characteristics of the switch device and applying, to selected cells, a voltage capable of distinguishing the logic state of the cells.

A general method for reading currents of selected memory cells, that is, the memory cells of the synaptic unit, in the memory array with the cross-point structure including the two-terminal switch device or the selective-memory device will be described with reference to FIG. 12. In FIG. 12, Vinh is applied to unselected cells, and in this region, there is no distinction between a cell with high resistance and a cell with low resistance, and the current flows becomes very insignificant. On the other hand, $V_{read1}$ is applied to selected cells, where $V_{read1}$ is placed between a threshold voltage $V_{th\_A}$ at which a sudden change in resistance occurs in a cell with low resistance and a threshold voltage $V_{th\_B}$ at which a sudden change in resistance occurs in a cell with high resistance ($V_{th\_A}$<$V_{read1}$<$V_{th\_B}$). That is, the cell with low resistance is turned on by occurrence of the sudden change in resistance, and the cell with high resistance is turned off, that is, there is no sudden change in resistance, and thus the logic states may be distinguished from the currents flowing in the selected cells. In FIG. 12, as $V_{read1}$ is applied, a current $I_{target,off}$ flows in the cell with high resistance and a current $I_{target,on}$ flows in the cell with low resistance. In this method, only one cell in the memory array may be selected and only the digital on/off state may be read. This is because a current flow in the on state is so large that once a reading voltage is applied to one cell in the on-state, the current flowing is so large that it is difficult to measure currents for other cells in the same memory array. For this reason, the general method for reading may not be suitable for application to the operation of the neuromorphic system of the present invention, which requires simultaneous measurement of currents of two or more selected from memory cells constituting a memory array. However, the present invention should not be construed as limiting the method for operating the neuromorphic system of the present invention through other means while using the general method for reading.

In operating the neuromorphic system of the present invention, a method suitable for reading currents of selected memory cells, that is, the memory cells of the synaptic unit, in the memory array with the cross-point structure including the two-terminal switch device or the selective-memory device will be described with reference to FIG. 13.

$V_{inh}$ is applied to unselected cells, and in this region, there is no distinction in current flow according to resistance states of the cells, and the current flow becomes very insignificant. Meanwhile, as indicated by "$V_{read2}$" in FIG. 13, a reading voltage applied to a selected cell is within a subthreshold region voltage range (less than $V_{th1}$) in which not all of selected one or more cell (s) are turned on, and is applied within a range (exceeding $V_{sep}$) in which resistance states of the plurality of memory cells are distinguished. That is, in FIG. 13, the reading voltage $V_{read2}$ is within a range greater than $V_{sep}$ and less than $V_{th1}$ that is a threshold voltage of the cell in the lowest resistance state among the selected cells, where the high resistance state and the low resistance state of the memory device are distinguishable like $I_{target}$. The range is indicated by $V_{input}$ in FIG. 13.

In this way, when reading performed in the subthreshold region, simultaneous reading for several cells is possible, and the reason is that unlike the general method described above, the current flowing through the cell is not small even when the reading voltage is applied to the cell in the on state and thus, the sum of currents flowing through the selected cells may be easily measured by simultaneously applying the reading voltage to the selected cells.

The two-terminal switching device described above may be one of an ovonic threshold switch device, a transition metal oxide switch device, a mixed ion-electron conductor (MIEC) switch device, a complementary resistance switch device, or doped amorphous silicon. The two-terminal switching device is not particularly limited the above materials, and any material may be used as long as it is capable of performing the switching function that causes the change in resistance based on a constant voltage. In addition, the selective-memory device refers to a device having both non-volatile memory characteristics and selection device characteristics.

In the present invention, the plurality of memory cells arranged in the memory array with the cross-point structure may include a non-volatile memory device and a selection device, and the selection device may be a transistor or a diode, enabling cell selection.

Here, the non-volatile memory device may be any one of a flash memory, a resistive random access memory (RRAM), a phase change random access memory (PRAM), a magnetoresistive random access memory (MRAM), and a ferroelectric random access memory (FeRAM), or a selective-memory.

In addition, the transistor or diode as the selection device may limit the current flowing through the non-volatile memory device to a predetermined current level or less to transfer the sum of the currents flowing from the plurality of memory cells to the output signal unit.

The selection device such as a transistor or a diode may operate as the current control means for limiting the current flowing through the non-volatile memory device to a current of a certain level or less as well as selecting the cell. Therefore, when the memory cell to which the non-volatile memory device and the transistor or diode as the selection device are connected is used, the memory cell itself may allow the compliance current limited to a certain current level or less to flow, without a separate current control means. Similarly in this case, the input signal is applied, and the sum of compliance currents flowing from the plurality of memory cells of the synaptic unit is generated as the output signal in the output signal unit.

The present invention may provide a new neuromorphic system capable of exhibiting various conductances by constituting one synaptic unit using a plurality of memory cells, instead of using one memory cell, and a method using the same. That is, since a synapse is configured with a plurality of memory cells rather than a single memory cell to represent a weight, a high degree of freedom in design and various weights may be set.

In addition, more various conductances may be implemented by setting an amplification factor by the controller unit for the current flowing from each of the plurality of cells. In this case, it is possible to implement the same or similar change in conductance while reducing the number of memory cells used, and thus it is possible to simplify the neuromorphic system to increase the efficiency. The amplification factor may follow the number of digits by the binary method.

To this end, the neuromorphic system according to the present invention may include an input signal unit for generating an input signal, a synapse unit including a plurality of synaptic units that receive a signal of the input signal unit and cause a current to flow according to a set weight, an output signal unit for generating an output signal by receiving a current generated from the synapse unit, and a controller unit for controlling the input signal unit, the synapse unit, and the output signal unit, the input signal unit may include a digital-to-analog converter (DAC), the synaptic units may include a plurality of memory cells that are connected to each other and are each capable of selectively storing a logic state, the plurality of memory cells may be arranged in a cross-point structure including an input electrode line and an output electrode line that cross each other to form one or more memory arrays, a multiplier may be connected to the memory arrays, the output signal unit may include an analog-to-digital converter (ADC), and the controller unit may generate an analog input signal through the DAC in the input signal unit, allow the generated analog input signal to be applied to each of the plurality of memory cells included in the synapse unit, allow each current flowing from the plurality of memory cells to be amplified with a predetermined amplification factor by the multiplier, and generate a sum of the amplified currents flowing from the plurality of memory cells as the output signal through the ADC in the output signal unit.

The memory cells of the synaptic unit may include a non-volatile memory device and a two-terminal switching device as a selection device enabling cell selection. In order to store logic states in the memory cells with low power, the use of the non-volatile memory is required, and in order to change the resistance state by sequentially selecting memory cells of the synaptic unit and measure the current flowing through the changing, each memory cell is required to include the selection device.

The non-volatile memory device may be any one of a flash memory, a resistive random access memory (RRAM), a phase change random access memory (PRAM), a magnetoresistive random access memory (MRAM), and a ferroelectric random access memory (FeRAM), or a selective-memory. In particular, the non-volatile memory device may be a variable resistance device such as a RRAM, a PRAM, an MRAM, a FeRAM, or a selective-memory, and such a variable resistance device may exhibit various resistance states according to applied voltage and/or current pulses, which makes it possible to store one or more logic states.

In addition, the selection device may be a two-terminal switching device, and by applying the two-terminal switching device as the selection device for selecting memory cells in this way, it is possible to increase the degree of integration and reduce power consumption. The two-terminal switching device may be a device such as an ovonic threshold switch, a transition metal oxide switch, a MIEC switch, a complementary resistance switch, doped amorphous silicon, or the like.

Further, in the present invention, the plurality of memory cells of the synaptic unit may include a selective-memory device capable of simultaneously performing a function of storing logic states and a function of selecting cells.

The selective-memory device refers to a device having both non-volatile memory characteristics and selection device characteristics. This means that the selective-memory device is able to store logic states by the change in resistance and at the same time, operate as the selection device by causing the change in resistance based on a constant voltage, that is, a threshold voltage.

For example, for the ovonic threshold switch, which contains a chalcogenide material, different resistance states may be generated when a writing voltage is applied with different polarities, and writing and reading using the generated resistance states may be possible. Accordingly, the chalcogenide material without phase change may also be a variable resistance device and at the same time, have a unique switch characteristic, that is, a characteristic in which a constant change in resistance occurs before and after the threshold voltage.

As such, when the variable resistance device containing the chalcogenide material without phase change, such as the ovonic threshold switch device, is used, one or more memory cells may be selected through switch characteristics and a logic state may be stored in each of the memory cells through variable resistance characteristics.

Further, a current control means for limiting passing currents to a predetermined current level or less may be connected between the plurality of memory cells and the multiplier so that each of the currents flowing from the plurality of memory cells by the signal of the input signal unit may pass through the current control means and then be amplified by the amplification factor by the multiplier, and a sum of the amplified currents may be converted into the output signal through in the output signal unit.

As described above, the change in the currents passing through the plurality of memory cells of the synaptic unit by the input signal is relatively constant, but a current higher or lower than an expected current may be shown in the middle due to a cell distribution, or an increasing slope of the total current may be made to deviate from an ideal slope. This phenomenon is undesirable because it may be an error factor in a final output signal. Therefore, in order to control the phenomenon, in the present invention, the current control means may be connected to the memory cell to remove the current that exceeds a predetermined range from the ideal current slope, thereby increasing the accuracy of the output signal.

The current control means connected between the plurality of memory cells and the multiplier may be various types of circuits or devices, and may be a current limit transistor connected to an end of an output electrode line of the memory array with the cross-point structure. The current flowing from the memory cell by the input signal may be limited to a current of a certain level or above while passing through the transistor so that a compliance current flows, and the output signal may be determined by amplifying the compliance current obtained by the current limiting through the multiplier and measuring the sum of the amplified currents. By allowing the compliance current to flow before the amplification, it is possible to prevent in advance the possibility that errors may be amplified together by the amplification.

The present invention may also be presented in various forms depending on the positions of the plurality of memory cells of the synaptic unit and the connection of the multiplier for amplifying a current.

First, there are cases in which a plurality of memory cells included in one synaptic unit are arranged to be distributed in a plurality of memory arrays. In this case, an amplification factor is set in each memory array by the controller unit so that all memory cells positioned in the same memory array may be amplified by applying the same amplification factor. TO this end, the multiplier is connected each memory array. In this way, in one synaptic unit in which a plurality of memory cells are arranged to be distributed in several memory arrays, the sum of the currents flowing through the memory cells is transmitted to the output signal unit.

This will be described in more detail with reference to FIGS. 14 and 15. FIG. 14 illustrates that an input signal $X_i$ outputs an output signal through synaptic units $W_{11}$ to $W_{n1}$ each having a weight, as in the neuromorphic system with the general cross-point structure. Here, the synaptic unit is configured with a plurality of memory cells, and the plurality of memory cells are arranged to be distributed in a plurality of memory arrays. In FIG. 14, the number of memory arrays included in one synaptic unit is indicated as k, but the number of memory arrays may be variously selected, such as 2, 4, 16, 32, or 64, as needed.

Amplification factors m.f(1) to m.f(k) are respectively set for the plurality of memory arrays, and the amplification factors may be $2^n$ (n is a positive integer including 0) to indicate the number of digits of the binary system. For example, in FIG. 14, the number k of memory arrays is 8, and accordingly, m.f(1), is which an amplification factor of an $A_1$ array, may be $2^7$, m.f(2), which is an amplification factor of an $A_2$ array, may be $2^6$, m.f(3), which is an amplification factor of an $A_3$ array, may be $2^5$, . . . , and the last m.f(8) may be $2^0$.

In FIG. 14, the synaptic unit $W_{11}$ is configured with k memory cells $A_1C_{11}$, $A_2C_{11}$, $A_3C_{11}$, . . . , $A_kC_{11}$, and when the input signal $X_1$ is input to each of the k memory cells, currents $X_1*A_1C_{11}$, $X_1*A_2C_{11}$, $X_1*A_3C_{11}$, . . . , $X_1*A_kC_{11}$ are respectively generated in the k memory cells.

The currents generated in this way may pass through transistors (current limit TRs) that are to be disposed at ends of the output electrode lines and flow as compliance currents $[X_1*A_1C_{11}]$, $[X_1*A_2C_{11}]$, $[X_1*A_3C_{11}]$, . . . $[X_1*A_kC_{11}]$. Then, the currents are respectively amplified by multipliers mp(1) to mp (k) respectively connected to memory arrays by the amplification factors m.f(1) to m.f(k) set according to the memory arrays where the memory cells are respectively positioned, and eventually, the sum of the currents is shown by the synaptic unit $W_{11}$ as follows.

$$X_1 W_{11} = [X_1 * A_1 C_{11}] * m \cdot f(1) + [X_1 * A_2 C_{11}] * m \cdot f(2) + $$
$$... + [X_1 * A_k C_{11}] * m \cdot f(k)$$

Finally, the current $I_1$ capable of being used for inference may be obtained as follows by summing the currents flowing from n synaptic units, which is illustrated in FIG. 15.

$$I_1 = X_1 * W_{11} + X2 * W_{21} + X_3 * W_{31} + ... + X_n * W_{n1} = $$
$$([X_1 * A_1 C_{11}] * m \cdot f(1) + [X_1 * A_2 C_{11}] m \cdot f(2) + $$
$$... + [X_1 * AkC11] * m \cdot f(k)) + (X_2 * A_1 C_{21}] * m \cdot f(1) + $$
$$[X_2 * A_2 C_{21}] * m \cdot f(2) + ... + [X_2 * A_k C_{21}] * m \cdot f(k)) + ... + $$
$$([X_n * A_1 C_{n1}] * m \cdot f(1) + [X_n * A_2 C_{n1}] * m \cdot f(2) + $$
$$... + [X_n * A_k C_{n1}] * m \cdot f(k))$$

In this way, a result obtained by amplifying the compliance currents flowing for each memory cell of each synaptic unit according to the amplification factors and summing the amplified compliance currents is equal to a result obtaining by amplifying the sum of the compliance currents flowing through the same output electrode line for each memory array by the multiplier by the amplification factor set in the memory array and summing the amplified sums. Therefore, this may be expressed again as follows.

$$I_1 = ([X_1 * A_1 C_{11}] + [X_2 * A_1 C_{21}] + \ldots + [X_n * A_1 C_{n1}]) * m \cdot f(1) +$$

$$([X_1 * A_2 C_{11}] + [X_2 * A_2 C_{21}] + \ldots + [X_n * A_2 C_{n1}]) * m \cdot f(2) +$$

$$\ldots + ([x_1 * A_k C_{11}] + [X_2 * A_k C_{21}] + \ldots + [X_n * A_k C_{n1}]) * m.f.(k)$$

As shown in the above equation, the compliance current flowing for each output line of the memory array is amplified by the multiplier, and the summed current is transmitted to the output signal unit.

When the current control means is not connected to a plurality of memory cells of a synaptic unit, all things are) the same, except that a current rather than the compliance current flows.

In addition, in the present invention, the synaptic unit may be composed of a plurality of memory cells, and the plurality of memory cells may be arranged for each output line in one memory array.

This is shown in FIGS. 16 and 17, and the synaptic unit $W_{11}$ includes a plurality of memory cells $L_1 C_{11}$, $L_2 C_{11}$, ..., $L_k C_{11}$. The amplification factors m.f(1) to m.f(k) are set on the respective output electrode lines on which the plurality of memory cells are disposed, and multipliers m.p(1) to m.p(k) corresponding thereto are connected. Here, the amplification factor may also be $2^n$ (n is a positive integer including 0) to indicate the number of digits of the binary system. For example, in FIGS. 16 and 17, the number k of output electrode lines having different amplification factors may be 8, and thus, m.f(1) may be $2^7$, m.f(2) may be $2^6$, and m.f(3) is $2^5$, so the last m.f(8) may be $2^0$.

FIG. 16 illustrates a case where output electrode lines having the same amplification factor are grouped together, and FIG. 17 illustrates a case where multipliers are arranged for each output electrode line because the amplification factor is different for each neighboring output electrode line.

In FIG. 16, the synaptic unit $W_{11}$ is configured with k memory cells $L_1 C_{11}$, $L_2 C_{11}$, $L_3 C_{11}$, ..., $L_k C_{11}$, and when the input signal $X_1$ is input to each of the k memory cells, currents $X_1 * L_1 C_{11}$, $X_1 * L_2 C_{11}$, $X_1 * L_3 C_{11}$, ..., $X_1 * L_k C_{11}$ are respectively generated in the k memory cells.

The currents generated in this way flow as compliance currents through transistors (current limit TRs) that are to be disposed at ends of the output electrode lines, and are amplified by predetermined amplification factors for each of output electrode lines where the respective memory cells are positioned, and eventually the sum of the currents is represented by the synaptic unit $W_{11}$ as shown below.

$$X_1 * W_{11} = [X_1 * L_1 C_{11}] * m \cdot f(1) + [X_1 * L_2 C_{11}] * m \cdot f(2) +$$

$$\ldots + [X_1 * L_k C_{11}] m \cdot f(k)$$

Finally, the current $I_1$ capable of being used for inference may be obtained as follows by summing output currents of individual synaptic units, which is illustrated in FIG. 16.

$$I_1 = X_1 * W_{11} + X2 * W_{21} + X_3 * W_{31} + \ldots + X_n * W_{n1} =$$

$$([X_1 * L_1 C_{11}] * m \cdot f(1) + [X_1 * L_2 C_{11}] * m \cdot f(2) +$$

-continued $$\ldots + [x_1 * L_k C_{11}] * m \cdot f(k)) + ([X_2 * L_1 C_{21}] * m \cdot f(1) +$$

$$[X_2 * L_2 C_{21}] * m \cdot f(2) + \ldots + [X_2 * L_k C_{21}] * m \cdot f(k)) + \ldots +$$

$$([X_n * L_1 C_{n1}] * m \cdot f(1) + [X_n * L_2 C_{n1}] * m \cdot f(2) +$$

$$\ldots + [X_n * L_k C_{n1}] * m \cdot f(k)) =$$

$$([X_1 * L_1 C_{11}] + [X_2 * L_1 C_{21}] + \ldots + [X_n * L_1 C_{n1}]) * m \cdot f(1) +$$

$$([X_1 * L_2 C_{11}] + [X_2 * L_2 C_{21}] + \ldots + [X_n * L_2 C_{n1}]) * m \cdot f(2) +$$

$$\ldots + ([X_1 * L_k C_{11}] + [X_2 * L_k C_{21}] + \ldots + [X_n * L_k C_{n1}]) * m \cdot f(k)$$

Meanwhile, the arrangement of multipliers may be implemented in various forms such as a case of being connected to the same multiplier for each memory array to be amplified by the same amplification factor as in FIG. 15, a case of being connected to the same multiplier in units of predetermined columns within a memory array to be amplified by the same amplification factor in units of predetermined columns as in FIG. 16, and a case of being connected to a different multiplier for each column of a memory array to be amplify by a different amplification factor for each neighboring column as in FIG. 17.

Similarly, when a transistor, which is the current control means, is not connected to a plurality of memory cells of a synaptic unit, all things are the same, except that a current rather than the compliance current flows.

Describing an operating method for the neuromorphic system including the synaptic unit including the plurality of memory cells and the multiplier in more detail, first, the operating method may include, when the current control means is not included in the plurality of memory cells in the synaptic unit, a step (a) of generating an analog input signal through the DAC of the input signal unit, a step (b) of applying the input signal to the plurality of memory cells of the synaptic unit, and a step (c) of amplifying currents flowing from the plurality of memory cells of the synaptic unit by the applied input signal by the multiplier and generating the sum of the amplified currents as the output signal through the ADC in the output signal unit.

As described above, in the present invention, each synaptic unit includes a plurality of memory cells, and an amplification factor is set in each of the memory cells. An input signal is applied to each of the plurality of memory cells in which the amplification factors are set in this way, and then a current flowing therefrom is amplified by the amplification factor by the multiplier. By allowing the current flowing in each memory cell to be amplified by the multiplier, even with a small number of memory cells, the same level of change in conductance may be expressed as compared to using a large number of memory cells without the multiplier, and thus, for example, in a synapse having an equal or even lower cell density, a greater variety of different weights may be expressed than in a synapse that does not include the multiplier.

A plurality of memory cells may be arranged in a plurality of memory arrays as described above or may be arranged in a plurality of output electrode lines.

Further, an operating method for a neuromorphic system in which a current control means is disposed to be connected between a memory cell and a multiplier of a synaptic unit may include, when the current control means is not included in the plurality of memory cells in the synaptic unit, a step (a) of generating an analog input signal through the DAC of the input signal unit, a step (b) of applying the input signal to the plurality of memory cells of the synaptic unit, and a step (c) of amplifying a compliance current flowing from each of the plurality of memory cells of the synaptic unit through the current control means by the applied input signal by the multiplier and generating the sum of the amplified currents as the output signal through the ADC in the output signal unit.

Here, the current control means may be a transistor disposed at the end of the output electrode line of the memory array, and thus the current may be controlled so that only a current of a certain level or less flows.

In addition, in the operating method for a neuromorphic system described above, the plurality of memory cells may include two-terminal switching devices as the selective memory device capable of performing both the function of storing the logic state and the function of selecting the cell or the selection device for the function of selecting the cell, and in the step (b), a voltage of the input signal may be in a range in which all of the plurality of memory cells are not turned on and at the same time, resistance states of the plurality of memory cells are distinguishable.

In the neuromorphic system according to the present invention, the synaptic unit may include a plurality of memory cells, and therefore, in order for the system to operate, it is required to measure a current flowing through several memory cells simultaneously in one memory array. However, when any one memory cell in the memory array is turned on and a large amount of current flows, there is a problem in that a flow of current to other memory cells becomes impossible. In order to solve the problem, as described above with reference to FIGS. 12 and 13, in the present invention, by allowing an input signal to be applied to a plurality of memory cells of the synaptic unit in a voltage range in which the memory cells are not turned on, it is possible to measure currents flowing from a plurality of memory cells even in one memory array.

Meanwhile, the plurality of memory cells arranged in the memory array with the cross-point structure may include a non-volatile memory device and a selection device, and the selection device may be a transistor or a diode.

Here, the non-volatile memory device may be any one of a flash memory, a resistive random access memory (RRAM), a phase change random access memory (PRAM), a magnetoresistive random access memory (MRAM), and a ferroelectric random access memory (FeRAM), or a selective-memory.

In addition, the selection device such as a transistor or a diode may operate as the current control means for limiting the current flowing through the non-volatile memory device to a current of a certain level or less as well as selecting the cell. Therefore, when the memory cell to which the non-volatile memory device and the transistor or diode as the selection device are connected is used, the memory cell itself may allow the compliance current to flow without a separate current control means. Similarly in this case, the input signal is applied, and the sum of compliance currents flowing from the plurality of memory cells of the synaptic unit is transferred to the output signal unit.

The invention claimed is:

1. A neuromorphic system comprising:
an input signal unit for generating an input signal;
a synapse unit including a plurality of synaptic units that receive a signal of the input signal unit and cause a current to flow according to a set weight;
an output signal unit for generating an output signal by receiving a current generated from the synapse unit; and a controller unit for controlling the input signal unit, the synapse unit, and the output signal unit,
wherein the input signal unit includes a digital-to-analog converter (DAC),
the synaptic units include a plurality of memory cells that are connected to each other and are each capable of selectively storing a logic state,
the plurality of memory cells are arranged in a cross-point structure including an input electrode line and an output electrode line that cross each other to form one or more memory arrays,
the output signal unit includes an analog-to-digital converter (ADC), and
the controller unit generates an analog Input signal through the DAC in the input signal unit, allows the generated analog input signal to be applied to each of the plurality of memory cells included in the synaptic unit so that a current flows, and generates a sum of currents flowing from the plurality of memory cells as the output signal through the ADC in the output signal unit.

2. The neuromorphic system of claim 1, wherein the plurality of memory cells include a non-volatile memory device and a two-terminal switching device as a selection device enabling cell selection.

3. The neuromorphic system of claim 1, wherein the plurality of memory cells include a selective-memory device capable of simultaneously performing a function of storing a logic state and a function of selecting a cell.

4. The neuromorphic system of claim 1, wherein a current control means for controlling passing currents within a predetermined range is connected to the plurality of memory cells so that the currents flowing from the plurality of memory cells by the input signal pass through the current control means and flow as currents limited to the predetermined range and a sum of the controlled currents is generated as the output signal through the ADC in the output signal unit.

5. The neuromorphic system of claim 4, wherein the current control means is a current limit transistor connected to an end of the output electrode line of the memory array so that the currents flowing from the plurality of memory cells by the input signal flow at a predetermined level or less.

6. The neuromorphic system of claim 1, wherein the plurality of memory cells arranged in the memory array with the cross-point structure include a non-volatile memory device and a selection device,
the selection device is a transistor or a diode, and limits a current flowing through the non-volatile memory device to a predetermined current level or less while allowing cell selection, and
a sum of the currents flowing at the predetermined current level or less through the plurality of memory cells is generated as the output signal through the ADC of the output signal unit.

7. The neuromorphic system of claim 1, wherein a multiplier is connected to the plurality of memory cells so that the currents flowing from the plurality of memory cells by the input signal of the input signal unit are amplified by the multiplier according to a predetermined amplification factor and a sum of the amplified currents is generated as the output signal through the ADC in the output signal unit.

8. The neuromorphic system of claim 7, wherein the plurality of memory cells include a non-volatile memory device and a two-terminal switching device as a selection device enabling cell selection.

9. The neuromorphic system of claim 7, wherein the plurality of memory cells include a selective-memory device capable of simultaneously performing a function of storing a logic state and a function of selecting a cell.

10. The neuromorphic system of claim 7, wherein a current control means for controlling passing currents within a predetermined range is connected between the plurality of memory cells and the multiplier so that each of the currents flowing from the plurality of memory cells by the signal of the input signal unit passes through the current control means and then is amplified by the amplification factor by the multiplier, and a sum of the amplified currents is generated as the output signal through the ADC of the output signal unit.

11. The neuromorphic system of claim 10, wherein the current control means is a current limit transistor connected to an end of the output electrode line of the memory array so that the currents flowing from the plurality of memory cells by the input signal flow at a predetermined level or less.

12. The neuromorphic system of claim 7, wherein the plurality of memory cells of the synaptic unit are arranged to be distributed in the plurality of memory arrays, and the multiplier is connected to each of the plurality of memory arrays, and currents flowing in all memory cells included in the same memory array are amplified by the same amplification factor.

13. The neuromorphic system of claim 7, wherein the plurality of memory cells of the synaptic unit are arranged to be distributed in a plurality of the output electrode lines, the multiplier is connected for each of the plurality of output electrode lines, and currents flowing in all memory cells connected to the same output electrode line are amplified by the same amplification factor.

14. The neuromorphic system of claim 7, wherein the plurality of memory cells arranged in the memory array with the cross-point structure include a non-volatile memory device and a selection device, and the selection device is a transistor or a diode, and limits a current flowing through the non-volatile memory device to a predetermined current level or less while allowing cell selection.

15. An operating method for a neuromorphic system including:

an input signal unit for generating an input signal;

a synapse unit including a plurality of synaptic units that receive a signal of the input signal unit and cause a current to flow according to a set weight;

an output signal unit for generating an output signal by receiving a current generated from the synapse unit; and a controller unit for controlling the input signal unit, the synapse unit, and the output signal unit, wherein the input signal unit includes a digital-to-analog converter (DAC), the synaptic units include a plurality of memory cells that are connected to each other and are each capable of selectively storing a logic state, the plurality of memory cells are arranged in a cross-point structure including an input electrode line and an output electrode line that cross each other to form one or more memory arrays, and the output signal unit includes an analog-to-digital converter (ADC), the operating method comprising:

a step (a) of generating an analog input signal through the DAC of the input signal unit;

a step (b) of applying the input signal to the plurality of memory cells of the synaptic unit; and a step (c) of generating a sum of the currents flowing from the plurality of memory cells of the synaptic unit by the applied input signal as the output signal through the ADC of the output signal unit.

16. The operating method of claim 15, wherein the plurality of memory cells include a selective memory device capable of performing both a function of storing a logic state and a function of selecting a cell or a two-terminal switching device as a selection device for the function of selecting a cell, and in the step (b), a voltage of the input signal is in a range in which all of the plurality of memory cells are not turned on and a range in which resistance states of the plurality of memory cells are distinguishable.

17. The operating method of claim 15, wherein a current control means for controlling passing currents within a predetermined range is connected to the plurality of memory cells in the neuromorphic system, and in the step (c), a sum of the currents flowing through the current control means from the plurality of memory cells of the synaptic unit by the applied input signal is generated as the output signal through the ADC.

18. The operating method of claim 15, wherein a multiplier is connected to the plurality of memory cells of the synaptic unit, and in the step (c), a current flowing from each of the plurality of memory cells of the synaptic unit is amplified by a predetermined amplification factor by the multiplier, and a sum of the amplified currents is generated as the output signal through the ADC of the output signal unit.

19. The operating method of claim 18, wherein the plurality of memory cells of the synaptic unit are arranged to be distributed in the plurality of memory arrays, the multiplier is connected to each of the plurality of memory arrays, and currents flowing in all memory cells included in the same memory array are amplified by the same amplification factor.

20. The operating method of claim 18, wherein the plurality of memory cells of the synaptic unit are positioned in a plurality of output electrode lines, the multiplier is connected for each of the plurality of output electrode lines, and currents flowing in all memory cells connected to the same output electrode line are amplified by the same amplification factor.

21. The operating method of claim 18, wherein a current control means for controlling passing currents within a predetermined range is connected between the plurality of memory cells and the multiplier, and in the step (c), a current flowing through the current control means from each of the plurality of memory cells of the synaptic unit by the input signal is amplified by a predetermined amplification factor by the multiplier, and a sum of the amplified currents is generated as the output signal through the ADC of the output signal unit.

* * * * *